United States Patent
Kuroda et al.

(10) Patent No.: US 9,419,684 B2
(45) Date of Patent: Aug. 16, 2016

(54) INTER-MODULE COMMUNICATION APPARATUS

(75) Inventors: Tadahiro Kuroda, Kanagawa (JP); Hiroki Ishikuro, Kanagawa (JP)

(73) Assignee: KEIO UNIVERSITY, Tokyo (JP)

( * ) Notice: Subject to any disclaimer, the term of this patent is extended or adjusted under 35 U.S.C. 154(b) by 0 days.

(21) Appl. No.: 14/000,350

(22) PCT Filed: Feb. 14, 2012

(86) PCT No.: PCT/JP2012/053318
§ 371 (c)(1),
(2), (4) Date: Aug. 19, 2013

(87) PCT Pub. No.: WO2012/111639
PCT Pub. Date: Aug. 23, 2012

(65) Prior Publication Data
US 2013/0324044 A1 Dec. 5, 2013

(30) Foreign Application Priority Data

Feb. 18, 2011 (JP) .................................. 2011-032886

(51) Int. Cl.
*H04B 5/00* (2006.01)
(52) U.S. Cl.
CPC ............ *H04B 5/0018* (2013.01); *H04B 5/0012* (2013.01); *H04B 5/0075* (2013.01); *H04B 2203/5483* (2013.01)
(58) Field of Classification Search
CPC .................................................. H04L 65/403
USPC ........................................ 455/41.1, 280, 292
See application file for complete search history.

(56) References Cited

U.S. PATENT DOCUMENTS

| | | | |
|---|---|---|---|
| 2,972,121 | A | 2/1961 | Firestone |
| 5,530,422 | A | 6/1996 | Harrison |
| 6,850,420 | B2 | 2/2005 | Reiner |
| 2005/0156755 | A1 | 7/2005 | Miller |

FOREIGN PATENT DOCUMENTS

| | | |
|---|---|---|
| JP | 07-141079 A | 6/1995 |
| JP | 2001-27918 A | 1/2001 |
| JP | 2002-123345 A | 4/2002 |

(Continued)

OTHER PUBLICATIONS

International Search Report dated Mar. 19, 2012, issued in corresponding application No. PCT/JP2012/053318.
Ishikuro, Hiroki, et al., "An Attachable Wireless Chip Access Interface for Arbitrary Data Rate Using Pulse-Based Inductive-Coupling through LSI Package", ISSCC 2007/Session 20/TD: Proximity Data and Power Transmission/20.3, pp. 360-361.

(Continued)

*Primary Examiner* — Hsin-Chun Liao
(74) *Attorney, Agent, or Firm* — Westerman, Hattori, Daniels & Adrian, LLP

(57) ABSTRACT

The invention relates to an inter-module communication apparatus where the reflection is reduced so that the communication channel can provide high speed and broadband as compared to inductive coupling. When modules having a signal line terminated with a terminating member and a feedback signal line are layered on top of each other so that the signal lines are coupled to each other and the return signal lines are coupled to each other using capacitive coupling and inductive coupling, the impedance of the terminating members is a coupling impedance that reflects the proximity effects in the coupling state between the modules.

30 Claims, 37 Drawing Sheets

(56) References Cited

FOREIGN PATENT DOCUMENTS

| | | |
|---|---|---|
| JP | 2003-516007 A | 5/2003 |
| JP | 2003-533130 A | 11/2003 |
| JP | 2004-318451 A | 11/2004 |
| JP | 2005-513824 A | 5/2005 |
| JP | 2007-049422 A | 2/2007 |
| JP | 2008-278290 A | 11/2008 |

OTHER PUBLICATIONS

Niitsu, Kiichi, et al., "An Inductive-Coupling Link for 3D Integration of a 90nm CMOS Processor and a 65nm CMOS SRAM", ISSCC 2009/Session 28/TD: Directions in Computing and Signaling/28.7, pp. 480-481.

Kawai, Shusuke et al., "A 2.5Gbls/ch 4PAM Inductive-Coupling Transceiver for Non-Contact Memory Card", ISSCC 2010/Session 14/Non-Volatile Memory/14.5, pp. 264-265.

INTER-MODULE COMMUNICATION APPARATUS

TECHNICAL FIELD

The present invention relates to an inter-module communication apparatus, and in particular, to the construction for high speed wireless data communication between modules in close proximity.

BACKGROUND ART

In recent years, inter-module communication apparatuses for allowing high speed wireless data communication between a number of modules in close proximity, such as non-contact data communication between a memory card and a PC, have been developed. In addition, other types of inter-module communication apparatuses are expected to allow for wireless communication between semiconductor integrated circuit chips through packages in PoP (package on package), where a number of packages in which semiconductor integrated circuit chips are sealed are layered on top of each other.

The present inventor has proposed an electronic circuit for data communication between mounting boards or semiconductor integrated circuit chips using inductive coupling between coils formed of wires on printed circuit boards (PCBs) or in semiconductor integrated circuit chips, namely magnetic field coupling (see Non-Patent Documents 1 to 3).

In Non-Patent Document 1, inductive coupling between a coil formed of a wire in a semiconductor integrated circuit chip sealed in a package and a coil on a flexible printed circuit (FPC) mounted on the surface of the package is used to detect the data within the semiconductor integrated circuit chip sealed in the package from the outside of the package so that the data can be used for the evaluation of the semiconductor integrated circuit chip and the system formed thereof as well as debugging.

In addition, in Non-Patent Document 2, a processor semiconductor integrated circuit chip and a memory semiconductor integrated circuit chip that are layered on top of each other and mounted in one package can communicate with each other at a high speed using inductive coupling between a pair of coils, each of which is formed of a wire in the semiconductor integrated circuit chip. This technology can be applied to a structure where a package in which a processor is mounted and a package in which a memory is mounted are layered on top of each other so that the processor can read data from and write data into the memory through wireless data communication using inductive coupling between coils formed in the packages.

Furthermore, in Non-Patent Document 3, inductive coupling between a pair of coils on printed circuit boards is used so that a memory card and a PC can make non-contact data communication.

Meanwhile, proximity coupling between microstrip lines or bus lines has also been proposed for the wireless communication of data using capacitive coupling and inductive coupling (see Patent Documents 1 to 7). In Patent Document 1, differential transmission lines made of two transmission lines arranged parallel to each other can be arranged in the same direction so as to be parallel to each other so that wireless communication can be made possible between two modules.

In addition, in Patent Document 2, a moveable driver stage is electromagnetically or capacitively coupled via coupling elements to two conductors that are arranged symmetrically so that a bidirectional transmission system can be constructed.

Furthermore, in Patent Document 3, two microstrip lines arranged on a grounded plate with a dielectric film in between are used as directional couplers to input a differential signal into the two microstrip lines so that wireless communication can be made possible between two modules.

Moreover, in Patent Documents 4 to 7, two bus wires are arranged so as to be partially parallel to each other so that wireless communication can be made possible between a number of printed circuit boards through capacitive coupling and inductive coupling.

PRIOR ART DOCUMENTS

Patent Documents

Patent Document 1: Japanese Unexamined Patent Publication 2008-278290
Patent Document 2: Japanese translation of International Unexamined Patent Publication 2003-533130
Patent Document 3: Japanese Unexamined Patent Publication 2007-049422
Patent Document 4: Japanese Unexamined Patent Publication H07 (1995)-141079
Patent Document 5: Japanese Unexamined Patent Publication 2001-027918
Patent Document 6: Japanese Unexamined Patent Publication 2002-123345
Patent Document 7: Japanese Unexamined Patent Publication 2004-318451

Non-Patent Documents

Non-Patent Document 1: H. Ishikuro, T. Sugahara, and T. Kuroda, "An Attachable Wireless Chip Access Interface for Arbitrary Data Rate by Using Pulse-Based Inductive-Coupling through LSI Package," IEEE International Solid-State Circuits Conference (ISSCC '07), Dig. Tech. Papers, pp. 360-361, 608, February 2007

Non-Patent Document 2: K. Niitsu, Y. Shimazaki, Y. Sugimori, Y. Kohama, K. Kasuga, I. Nonomura, M. Saen, S. Komatsu, K. Osada, N. Irie, T. Hattori, A. Hasegawa, and T. Kuroda, "An Inductive-Coupling Ling for 3D Integration of a 90 nm CMOS Processor and a 65 nm CMOS SRAM," IEEE International Solid-State Circuits Conference (ISSCC '09), Dig. Tech. Papers, pp. 480-481, February 2009

Non-Patent Document 3: S. Kawai, H. Ishikuro, and T. Kuroda, "A 2.5 Gb/s/ch Inductive-Coupling Transceiver for Non-Contact Memory Card," IEEE International Solid-State Circuits Conference (ISSCC '10), Dig. Tech. Papers, pp. 264-265, February 2010

SUMMARY OF THE INVENTION

Problem to Be Solved by the Invention

In the case of magnetic field coupling using coils, capacitance C in addition to inductance L is parasitic on the coils used for wireless data communication between modules or semiconductor integrated circuit chips in the same manner as on conventional coils, and therefore, LC resonance occurs at a certain frequency, that is to say, at the self-resonant frequency. When the frequency of the signal used for communication comes close to this self-resonant frequency, oscillation continues for a while even after the signal has changed, which allows high speed communication to cause interference between symbols, and thus, such a problem arises that highly reliable communication cannot be made.

The upper limit of the communication speed that can be implemented through inductive coupling between coils is approximately ⅓ to ½ of the self-resonant frequency of the coils. The self-resonant frequency of a coil is inversely proportional to the route of the product LC of the coil. The greater the communication distance is, the greater the size of the necessary coils is, which makes C greater and lowers the self-resonant frequency.

In the case of communication between semiconductor integrated circuit chips that are layered on top of each other, the communication distance is approximately 50 μm, for example, and therefore, the diameter of the coils is two times greater, which is approximately 100 μm. In this case, the bandwidth of the channel is 10 GHz or greater, and the communication speed is determined by the circuits in the transmitter and receiver.

However, the communication distance between modules is greater. In the case where the communication distance is 1 mm, for example, coils of which the diameter is approximately 1 mm are necessary, and thus, the self-resonant frequency of the coils on PCBs is approximately 3 GHz, and therefore, the communication speed is determined by the communication channel of which the upper limit is approximately 1 Gb/s.

Accordingly, in order to achieve the communication speed of 4 Gb/s, four pairs of coils are arranged as in FIG. 39 so that four communication lines can be used in parallel for parallel communication. At this time, the coils are arranged so as to be away from each other by a certain distance in order to prevent crosstalk from being caused between adjacent communication lines. In the figure, Tx and Rx are transmitting and receiving circuits, respectively.

In the case where the integrated circuits having the transmitting and receiving circuits and the coils do not have the same wire length or the characteristics of the transmitter and the receiver are not compatible, the timing of the signals received by the respective channels is not consistent, which causes the signals to be skewed and makes it difficult for the signals to be in sync.

The greater the communication distance is, namely, the greater the size of the coils is or the higher the communication speed is, and the greater the number of coils is, the longer the coils and the wires of the integrated circuits are, and thus, the greater the signal delay is. Even in the case where the wire length is made the same, dispersion due to the signal delay becomes greater due to inconsistency in the manufacture of the integrated circuits and coils. Thus, there is an upper limit in the number of communication channels that are parallel to each other in conventional parallel communication, and an increase in the speed of the communication channels has been an issue to be solved.

In the case where an integrated circuit having a transmitter and a receiver cannot be installed close to a coil, the two have to be connected through a transmission line. At this time, the impedance of the coil changes in proportion to the frequency, though the impedance of the transmission line (which is referred to as characteristic impedance) does not change greatly depending on the signal band. Accordingly, it is difficult to match the impedance at the point where the two are connected to each other, and as a result, the signal is reflected and the quality of the signal deteriorates, which makes highly reliable communication impossible.

In order to transmit a digital signal at 4 Gb/s, for example, the system is typically designed so that the time during which the signal is started up or shut down is approximately 50 ps. This digital signal includes a frequency component of up to $1/(2\times50 \text{ ps})=10$ GHz, and therefore, it is necessary to handle the connection between the two as a transmission line in order to transmit a signal over such a distance that causes a delay that is not sufficiently short as compared to the signal frequency (1/10 G=100 ps), for example, a delay that is greater than 1/40, which is a delay of 100 ps/40=2.5 ps.

The wavelength of the signal of 10 GHz that propagates through the vacuum is 30 mm, and therefore, the delay of 2.5 ps corresponds to the distance of (30 mm/100 ps)×2.5 ps=0.75 mm. In reality, a flame resistant glass-based epoxy resin multilayer board FR4 having a relative dielectric constant of approximately 4 makes the propagation speed half due to the effects of shortening the wavelength, and therefore, the delay of 2.5 ps corresponds to 0.75 mm/2=0.37 mm.

That is to say, it is necessary to handle the connection between the two as a transmission line in the case where the distance is greater than approximately 0.4 mm, and it is necessary to match the impedance. Namely, it is necessary to install an integrated circuit having a transmitter and a receiver within 0.4 mm from the coil according to the prior art where the inductive coupling of the coils is used as the communication line. However, only four coils at the most can be connected to the integrated circuit within 0.4 mm in the case where the coils having a diameter of 1 mm are arranged away from each other at such a distance as to prevent crosstalk, and the connection with more coils is difficult. Furthermore, there are many reasons why it is desired that the integrated circuit apparatus be arranged at a distance away from the coils due to the restrictions in designing the system.

Meanwhile, in the case of a system for wireless communication through capacitive coupling and inductive coupling where microstrip lines are arranged in close proximity to each other, such a problem arises that the signal is reflected because impedance matching is not sufficiently taken into consideration.

As a result of diligent research, the present inventor arrived at the conclusion that when two modules are in close proximity, the impedance of a transmission line is affected by the other transmission line due to the proximity effects and has a value that is different from the characteristic impedance $Z_0$ of the transmission line when it is by itself, and such a change in the impedance cannot be ignored.

The closer the two modules are to each other, the greater the proximity effects are and the smaller the impedances of the transmission lines are. Unless the impedance is matched by taking the impedances of the transmission lines in such a coupling state, a problem arises with wireless communication between two or more modules arranged in close proximity. In the present specification, the impedance of a transmission line in such a coupling state is referred to as a coupling impedance, which is denoted as $Z_{0\text{-}coupled}$.

In addition, in the case of Patent Document 1, the coupling impedance $Z_{0\text{-}coupled}$ is not taken into consideration at all, and only the characteristic impedance $Z_0$ of the transmission line by itself is taken into consideration, and therefore, such a problem arises that reflection of the signals occurs, which makes high speed communication difficult. Though it is referred to the effect that the structure for single transmission is acceptable, no concrete structure is disclosed at all.

In the case of Patent Document 3 as well, no specific attention is paid to the impedance matching at all, not to mention the coupling impedance $Z_{0\text{-}coupled}$, and therefore, such a problem arises that reflection of the signals occurs, which makes high speed communication difficult. Furthermore, two modules are arranged parallel to each other in the same direction and a grounded plate is used, and therefore, it is necessary for the modules to face each other, and thus, the precision for positioning when they are made to face each other becomes a problem. Moreover, the use of the grounded plate causes such a problem that three or more modules cannot be layered on top of each other. In addition, in the case of Patent Document 3, the data is modulated for communication using a carrier signal, and therefore, such a problem arises that the structure of the transmitting and receiving circuits is complicated.

In the case of Patent Documents 4 to 7 as well, the coupling impedance $Z_{0\text{-}coupled}$ is not taken into consideration at all, and only the characteristic impedance $Z_0$ of the transmission line by itself is taken into consideration, and therefore, such a problem arises that reflection of the signals occurs, which makes high speed communication difficult. In addition, the concrete structure relates to bus wires and printed circuit boards in such a manner that couplers are formed on the same substrate using the bus wires and the printed circuit boards, and therefore, such a problem arises that the system cannot deal with the communication between two modules.

Accordingly, an object of the present invention is to match the coupling impedance so that the reflection is reduced and the speed of the communication channel is increased (broadband) as compared to inductive coupling.

Means for Solving Problem (1) In order to achieve the above-described object, the present invention provides an inter-module communication apparatus with a first module and a second module that are arranged in close proximity so as to face each other, wherein the first module at least includes: a first signal line of which the characteristic impedance has an impedance of $Z_{01}$; a first feedback signal line for providing a feedback path for the first signal line; a first terminating member that terminates the first signal line and the first feedback signal line; and a first semiconductor integrated circuit apparatus with a transmitting and receiving circuit, the second module at least includes: a second signal line of which the characteristic impedance has an impedance of $Z_{02}$; a second feedback signal line for providing a feedback path for the second signal line; a second terminating member that terminates the second signal line and the second feedback signal line; and a second semiconductor integrated circuit apparatus with a transmitting and receiving circuit, and the impedances of the first terminating member and the second terminating member are coupling impedances that reflect the proximity effects in the coupling state of the first module and the second module, which are different from $Z_{01}$ and $Z_{02}$.

Thus, terminating members having coupling impedances that reflect the proximity effects in the coupling state between the first module and the second module are used in each module, and therefore, the reflection of signals can be effectively reduced. In addition, communication is carried out in the baseband without modification using a carrier signal, and therefore, high speed communication is made possible in a simpler structure.

(2) In addition, the present invention provides the inter-module communication apparatus according to the above (1), wherein the first signal line is a signal line that is provided on a first insulating substrate and has a length of $\frac{1}{10}$ or greater of the signal wavelength, the first semiconductor integrated circuit apparatus is connected to the first signal line and the first feedback signal line, the second signal line is a signal line that is provided on a second insulating substrate and has a length of $\frac{1}{10}$ or greater of the signal wavelength, the second semiconductor integrated circuit apparatus is connected to the second signal line and the second feedback signal line, the first signal line and the second signal line at least partially overlap when projected as viewed in the direction in which the two are layered on top of each other, and the first feedback signal line and the second feedback signal line at least partially overlap when projected as viewed in the direction in which the two are layered on top of each other, signal coupling occurs between the first signal line and the second signal line using capacitive coupling and inductive coupling, and feedback signal coupling occurs between the first feedback signal line and the second feedback signal line using capacitive coupling and inductive coupling, and the first insulating substrate and the second insulating substrate are layered on top of each other so that the signal coupling allows a signal from the first signal line to be transmitted through the second signal line.

(3) Furthermore, the present invention provides the inter-module communication apparatus according to the above (2), wherein the feedback signal coupling is the same as or stronger than the signal coupling. Thus, the above-described feedback signal coupling is set to be the same as or stronger than the above-described signal coupling, and as a result, even-numbered mode impedances and odd-numbered mode impedances in the coupling transmission lines can be clearly defined, and these impedances do not fluctuate greatly under the conditions where the system is actually used, and therefore, the terminating process becomes easy.

(4) Moreover, the present invention provides the inter-module communication apparatus according to the above (2), wherein the first feedback signal line forms a coplanar structure for the first signal line, and the second feedback signal line forms a coplanar structure for the second signal line. Thus, coplanar structures are provided to the feedback signal lines relative to the signal lines so that the resistance to noise can be increased.

(5) In addition, the present invention provides the inter-module communication apparatus according to the above (4), wherein the first feedback signal line has a symmetrical structure relative to both sides of the first signal line, and the second feedback signal line has a symmetrical structure relative to both sides of the second signal line. Thus, symmetrical structures are provided to the feedback signal lines relative to the signal lines so that in-phase noise removing ratio can be increased and the resistance to noise can be increased.

(6) Furthermore, the present invention provides the inter-module communication apparatus according to the above (2), wherein a first electromagnetic shield layer is provided to a surface of the first insulating substrate on the side opposite to the surface on which the first signal line is arranged, and a second electromagnetic shield layer is provided to a surface of the second insulating substrate on the side opposite to the surface on which the second signal line is arranged. Thus, electromagnetic shield layers are provided so that the electromagnetic field noise entering from the outside can be reduced, and as a result, the resistance to noise can be increased.

(7) Moreover, the present invention provides the inter-module communication apparatus according to the above (2), wherein either the gap between the first signal line and the second signal line or the width of the overlap between the first signal line and the second signal line is different depending on the direction in which signals propagate so that the coupling state between the first signal line and the second signal line is different depending on the direction in which the signals propagate.

Thus, the coupling state between the first signal line and the second signal line differs depending on the direction in which the signals propagate, and as a result, the frequency characteristics of the coupling coefficient of the signal lines can be made flat so that a coupler with a broadband can be implemented.

(8) In addition, the present invention provides the inter-module communication apparatus according to the above (2), wherein either the first module or the second module has a third feedback signal line that provides a third signal line and a feedback path for the third signal line to the first signal line or the second signal line with a dummy coupler in between, and the inter-module communication apparatus further has: a third terminating member that terminates the third signal line and the third feedback signal line; and a third semiconductor integrated circuit apparatus with a transmitting and receiving circuit that is connected to the third signal line and the third feedback signal line.

Thus, two couples of a signal line and a feedback signal line are provided to one module so that coupling communication having a number of branches can be implemented with one transmission line (9) Furthermore, the present invention provides the inter-module communication apparatus according to the above (2), wherein the first signal line is connected to the first semiconductor integrated circuit apparatus through a first leading transmission line that has a coupling impedance reflecting the proximity effects in the coupling state between the first module and the second module, and the second signal line is connected to the second semiconductor integrated circuit apparatus through a second leading transmission line that has the coupling impedance.

Thus, leading transmission lines are provided so that the semiconductor integrated circuit apparatuses can be arranged in locations that are away from the signal lines, which increases the freedom in design.

(10) Moreover, the present invention provides the inter-module communication apparatus according to the above (9), wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

Thus, in the case where plates, typically grounded plates, are provided, the plates at least miss the portions that face the first signal line and the second signal line so that electric lines of force can be concentrated between the wires of the couplers, and therefore, the degree of coupling between the couplers can be increased.

(11) In addition, the present invention provides the inter-module communication apparatus according to the above (9), wherein the line width of the first signal line is greater than or equal to the line width of the first leading transmission line, and the line width of the second signal line is greater than or equal to the line width of the second leading transmission line. The line widths are set to be in these relationships so that the degree of coupling between the couplers can be increased.

(12) Furthermore, the present invention provides the inter-module communication apparatus according to the above (9), wherein the first leading transmission line and the second leading transmission line run in different directions in a state where the first signal line and the second signal line are aligned alongside each other as viewed in the direction in which the two are layered on top of each other. Thus, the leading transmission lines are led in different directions so that the impedance can be designed without being affected by the fluctuation in the distance between the modules because the coupling impedance of a leading transmission line becomes equal to the characteristic impedance when the coupling between the leading transmission lines is made weaker.

(13) Moreover, the present invention provides the inter-module communication apparatus according to the above (9), wherein the gap between the first leading transmission line and the second leading transmission line in the direction in which the two face each other is greater than the gap between the first signal line and the second signal line in the direction in which the two face each other. The coupling between the leading transmission lines can be made weak by adopting this structure.

(14) In addition, the present invention provides the inter-module communication apparatus according to the above (9), wherein a first auxiliary electromagnetic shield layer that shields the first leading transmission line is provided to a surface of the first insulating substrate, at least on the side opposite to the surface on which the first leading transmission line is arranged, that faces the second module. The coupling between the leading transmission lines can be made weak by adopting this structure.

(15) Furthermore, the present invention provides the inter-module communication apparatus according to the above (9), wherein a side of the coupling portion between the first signal line and the first leading transmission line is curved, and a side of the coupling portion between the second signal line and the second leading transmission line is curved. This structure reduces a dramatic change in the impedance so that the impedance can be made approximately uniform, and as a result, the reflection can be reduced, and thus, a coupler with a broader band can be implemented.

(16) Moreover, the present invention provides the inter-module communication apparatus according to the above (9), wherein a first impedance adjusting transmission line is provided to an end of the first signal line on the side opposite to the coupling portion between the first signal line and the first leading transmission line, a first impedance matching circuit is connected to the first impedance adjusting transmission line, a second impedance adjusting transmission line is provided to an end of the second signal line on the side opposite to the coupling portion between the second signal line and the second leading transmission line, and a second impedance matching circuit is connected to the second impedance adjusting transmission line.

Thus, impedance adjusting transmission lines and impedance matching circuits are provided so that the impedance can be matched with high precision, even in the case where there is a dispersion of the impedance in the manufacture of coupling lines or there is a fluctuation in the distance between the lines, and as a result, the reflection of signals can be prevented, which makes high speed communication possible.

(17) In addition, the present invention provides the inter-module communication apparatus according to the above (16), wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

Thus, in the case where plates, typically grounded plates, are provided, the plates at least miss the portions that face the first signal line and the second signal line so that electric lines of force can be concentrated between the wires of the couplers, and therefore, the degree of coupling between the couplers can be increased.

(18) Furthermore, the invention provides the inter-module communication apparatus according to the above (16), wherein the line width of the first signal line is greater than or equal to the line width of the first leading transmission line and the line width of the first impedance adjusting transmission line, and the line width of the second signal line is greater than or equal to the line width of the second leading transmission line and the line width of the second impedance adjusting transmission line. The line widths are set to be in these relationships so that the degree of coupling between the couplers can be increased.

(19) Moreover, the present invention provides the inter-module communication apparatus according to the above (9), wherein a third leading transmission line is provided to an end of the first signal line on the side opposite to the coupling portion between the first signal line and the first leading transmission line, a semiconductor integrated circuit apparatus with a transmitting and receiving circuit is connected to the third leading transmission line, a fourth leading transmission line is provided to an end of the second signal line on the side opposite to the coupling portion between the second signal line and the second leading transmission line, and a semiconductor integrated circuit apparatus with a transmitting and receiving circuit is connected to the fourth leading transmission line. Two channels can be set so that one coupler makes simultaneous communication possible by adopting this structure, and therefore, the data communication speed can be doubled.

(20) In addition, the present invention provides the inter-module communication apparatus according to the above (2), wherein the first feedback signal line forms a differential line with the first signal line, and the second feedback signal line forms a differential line with the second signal line.

Thus, differential signal lines are provided so that the resistance to in-phase noise is high as compared to the case of single end, and in addition, it becomes easy to control the impedance without necessarily requiring a feedback path with a coplanar structure, and therefore, designing becomes easier.

(21) Furthermore, the present invention provides the inter-module communication apparatus according to the above (20), wherein a first electromagnetic shield layer is provided to a surface of the first insulating substrate on the side opposite to the surface on which the first signal line is arranged, and a second electromagnetic shield layer is provided to a surface of the second insulating substrate on the side opposite to the surface on which the second signal line is arranged. In this case as well, the resistance to noise in addition to the freedom in design can be increased due to the differential lines.

(22) Moreover, the present invention provides the inter-module communication apparatus according to the above (20), wherein either the gap between the first signal line and the second signal line or the width of the overlap between the first signal line and the second signal line is different depending on the direction in which signals propagate so that the coupling state between the first signal line and the second signal line is different depending on the direction in which the signals propagate. In this case as well, the frequency characteristics of the coupling coefficient of the signal lines can be flattened in addition to an increase in the freedom in design due to the differential lines so that a coupler with a broadband can be implemented.

(23) In addition, the present invention provides the inter-module communication apparatus according to the above (20), wherein either the first module or the second module has a third feedback signal line that provides a third signal line and a feedback path that forms a differential line with the third signal line to the first signal line or the second signal line with a dummy coupler in between, and the inter-module communication apparatus further has: a third terminating member that terminates the third signal line and the third feedback signal line; and a third semiconductor integrated circuit apparatus with a transmitting and receiving circuit that is connected to the third signal line and the third feedback signal line. In this case as well, coupling communication having a number of branches can be implemented with one transmission line in addition to an increase in the freedom in design due to the differential line.

(24) Furthermore, the present invention provides the inter-module communication apparatus according to the above (20), wherein the first signal line and the first feedback signal line have coupling impedances that reflect the proximity effects in the coupling states with the first module and the second module, respectively, and have a leading transmission line connected to the first semiconductor integrated circuit apparatus, and the second signal line and the second feedback signal line have the coupling impedances, respectively, and a leading transmission line connected to the second semiconductor integrated circuit apparatus. Thus, leading transmission lines are provided so that the semiconductor integrated circuit apparatuses can be arranged in locations away from the signal lines, and thus, the freedom in design can further be increased in addition to the freedom in design due to the differential line.

(25) Moreover, the present invention provides the inter-module communication apparatus according to the above (24), wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

Thus, in the case where plates, typically grounded plates, are provided, the plates at least miss the portions that face the first signal line and the second signal line so that electric lines of force can be concentrated between the wires of the couplers, and therefore, the degree of coupling between the couplers can be increased.

(26) In addition, the present invention provides the inter-module communication apparatus according to the above (24), wherein the line widths of the first signal line and the first feedback signal line are greater than or equal to the line width of the leading transmission line, and the line widths of the second signal line and the second feedback signal line are greater than or equal to the line width of the leading transmission line. The line widths are set to be in these relationships so that the degree of coupling between the couplers can be increased.

(27) Furthermore, the present invention provides the inter-module communication apparatus according to the above (24), wherein the gap between the first signal line and the first feedback signal line is greater than or equal to the gap between the leading transmission lines, and the gap between the second signal line and the second feedback signal line is greater than or equal to the gap between the leading transmission lines. The gaps are set to be in these relationships so that the gap between the couplers becomes sufficiently wide, which makes designing easier because the characteristic impedance of the coupling portion is determined only by the effects from the module to be coupled.

(28) Moreover, the present invention provides the inter-module communication apparatus according to the above (24), wherein the gap between the first signal line and the first feedback signal line is greater than or equal to the line widths of the first signal line and the first feedback signal line, and the gap between the second signal line and the second feedback signal line is greater than or equal to line widths of the second signal line and the second feedback signal line.

The line widths and the gaps are set to be in these relationships so that the differential coupling becomes weaker, which makes designing easier. In particular, in the case where the gaps are two times greater or more than the line widths, the coupling becomes sufficiently weak, which is desirable. However, when the gaps are three times greater or more, there are no effects on the impedance.

(29) In addition, the present invention provides the inter-module communication apparatus according to the above (24), wherein the leading transmission line connected to the first semiconductor integrated circuit apparatus and the leading transmission line connected to the second semiconductor integrated circuit apparatus run in different directions in a state where the first signal line and the second signal line are aligned alongside each other as viewed in the direction in which the two are layered on top of each other. In this case as well, the impedance can be designed without being affected by the fluctuation in the distance between modules in addition to an increase in the freedom in design due to the differential line.

(30) Furthermore, the present invention provides the inter-module communication apparatus according to the above (24), wherein the gap between the leading transmission line connected to the first semiconductor integrated circuit apparatus and the leading transmission line connected to the second semiconductor integrated circuit apparatus in the direction in which the two face each other is greater than the gap between the first signal line and the second signal line in the direction in which the two face each other. In this case as well, the coupling between the leading transmission lines can be made weaker in addition to an increase in the freedom in design due to the differential line.

(31) Moreover, the present invention provides the inter-module communication apparatus according to the above (24), wherein a first auxiliary electromagnetic shield layer that shields the leading transmission line connected to the first semiconductor integrated circuit apparatus is provided to a surface of the first insulating substrate, at least on the side opposite to the surface on which the first leading transmission line is arranged, that faces the second module. In this case as well, the coupling between the leading transmission lines can be made weaker in addition to an increase in the freedom in design due to the differential line.

(32) In addition, the present invention provides the inter-module communication apparatus according to the above (24), wherein a side of the coupling portion between the first signal line and the leading transmission line is curved, a side of the coupling portion between the first feedback signal line and the leading transmission line is curved, a side of the coupling portion between the second signal line and the leading transmission line is curved, and a side of the coupling portion between the second feedback signal line and the leading transmission line is curved. In this case as well, the impedance can be made approximately uniform in addition to an increase in the freedom in design due to the differential line so that the reflection can be reduced, and thus, a coupler with a broader band can be implemented.

(33) Furthermore, the present invention provides the inter-module communication apparatus according to the above (24), wherein a first impedance adjusting transmission line is provided to an end of the first signal line on the side opposite to the coupling portion between the first signal line and the leading transmission line connected to the first semiconductor integrated circuit apparatus, a first impedance matching circuit is connected to the first impedance adjusting transmission line, a second impedance adjusting transmission line is provided to an end of the second signal line on the side opposite to the coupling portion between the second signal line and the leading transmission line connected to the second semiconductor integrated circuit apparatus, and a second impedance matching circuit is connected to the second impedance adjusting transmission line. In this case as well, the reflection of signals can be prevented in addition to an increase in the freedom in design due to the differential line, which makes high speed communication possible.

(34) Moreover, the present invention provides the inter-module communication apparatus according to the above (24), wherein leading transmission lines connected to a semi-conductor integrated circuit apparatus with a transmitting and receiving circuit are provided to respective ends of the first signal line and the first feedback signal line on the side opposite to the coupling portions between the first signal line and the leading transmission line connected to the first semiconductor integrated circuit apparatus as well as between the first feedback signal line and the leading transmission line connected to the first semiconductor integrated circuit apparatus, leading transmission lines connected to a semiconductor integrated circuit apparatus with a transmitting and receiving circuit are provided to respective ends of the second signal line and the second feedback signal line on the side opposite to the coupling portions between the second signal line and the leading transmission line connected to the second semi-conductor integrated circuit apparatus as well as between the second feedback signal line and the leading transmission line connected to the second semiconductor integrated circuit apparatus, and the impedances of the respective leading transmission lines are coupling impedances that reflect the proximity effects in the coupling states with the first module and the second module and that are different from $Z_{o1}$ and $Z_{o2}$. In this case as well, the freedom in design can further be increased in addition to an increase in the freedom in design due to the differential line.

(35) In addition, the present invention provides the inter-module communication apparatus according to the above (34), wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

Thus, in the case where plates, typically grounded plates, are provided, the plates at least miss the portions that face the first signal line and the second signal line so that electric lines of force can be concentrated between the wires of the couplers, and therefore, the degree of coupling between the couplers can be increased.

(36) Furthermore, the present invention provides the inter-module communication apparatus according to the above (34), wherein the line widths of the first signal line and the first feedback signal line are greater than or equal to the line width of the leading transmission line, and the line widths of the second signal line and the first feedback signal line are greater than or equal to the line width of the leading transmission line. The line widths are set to be in these relationships so that the degree of coupling between the couplers can be increased.

(37) Moreover, the present invention provides the inter-module communication apparatus according to the above (34), wherein the gap between the first signal line and the first feedback signal line is greater than or equal to the gap between the leading transmission lines, and the gap between the second signal line and the second feedback signal line is greater than or equal to the gap between the leading transmission lines. The gaps are set to be in these relationships so that the gap between the couplers becomes sufficiently wide, which makes designing easier because the characteristic impedance of the coupling portion is determined only by the effects from the module to be coupled.

(38) In addition, the present invention provides the inter-module communication apparatus according to the above (34), wherein the gap between the first signal line and the first feedback signal line is greater than or equal to the line widths of the first signal line and the first feedback signal line, and the gap between the second signal line and the second feedback signal line is greater than or equal to line widths of the second signal line and the second feedback signal line.

The line widths and the gaps are set to be in these relationships so that the differential coupling becomes weaker, which makes designing easier. In particular, in the case where the gaps are two times greater or more than the line widths, the coupling becomes sufficiently weak, which is desirable. However, when the gaps are three times greater or more, there are no effects on the impedance.

Effects of the Invention

The disclosed inter-module communication apparatus makes it possible for the communication channel to provide high speed (broadband) as compared to inductive coupling by matching the coupling impedance with reduced reflection.

BEST MODE FOR CARRYING OUT THE INVENTION

Figure 1:
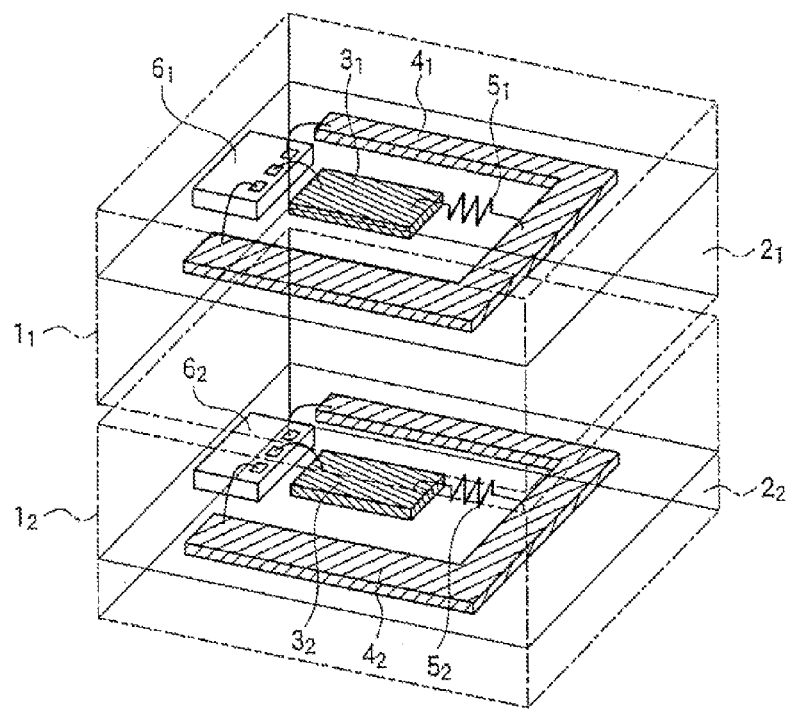
FIG. 1 is a schematic perspective diagram showing the inter-module communication apparatus according to a mode of the present invention.

The inter-module communication apparatus according to a mode of the present invention is described below in reference to FIG. 1. FIG. 1 is a schematic perspective diagram showing the inter-module communication apparatus according to a mode of the present invention, where two modules $1_1$, $1_2$ are arranged in close proximity to each other and carry out wireless data communication through capacitive coupling and inductive coupling between transmission lines.

The modules $1_1$, $1_2$ respectively have signal lines $3_1$, $3_2$ provided on the insulating substrates $2_1$, $2_2$ having a length of 1/10 or more of the signal wavelength and providing a coupler of which the characteristic impedance is an impedance of $Z_0$ and feedback signal lines $4_1$, $4_2$ for providing the feedback routes for the signal lines $3_1$, $3_2$. The signal lines $3_1$, $3_2$ and the feedback signal lines $4_1$, $4_2$ are connected through terminating members $5_1$, $5_2$, and at the same time, semiconductor integrated circuit apparatuses $6_1$, $6_2$ having a transmitting and receiving circuit are connected between the signal lines $3_1$, $3_2$ and the feedback signal lines $4_1$, $4_2$, respectively.

At this time, the signal lines $3_1$, $3_2$ overlap each other at least partially when projected as viewed in the direction in which the two are layered on top of each other, and thus, the two are in such a proximity that signal coupling and feedback signal coupling occur through capacitive coupling and inductive coupling between the two, and the return signal lines $4_1$, $4_2$ overlap each other at least partially when projected as viewed in the direction in which the two are layered on top of each other, and thus, the two are in such a proximity that signal coupling and feedback signal coupling occur through capacitive coupling and inductive coupling between the two.

Here, the feedback signal coupling is set so as to be as strong as or stronger than the signal coupling. As a result, the even-numbered mode impedances and the odd-numbered mode impedances of the coupling transmission lines are clearly defined, and thus, these impedances do not greatly fluctuate under the conditions for actual use, which makes the terminating process easy.

In addition, the impedance of the terminating members $5_1$, $5_2$ is not the characteristic impedance $Z_0$ of a single transmission line but a coupling impedance $Z_{0\text{-}coupled}$ that reflects the proximity effects in the coupling state between module $1_1$ and module $1_2$. Resistors or transistors are used for the terminating members $5_1$, $5_2$.

The insulating substrates $2_1$, $2_2$ may be made of any insulating material, and FPCs, which are flexible with the thickness of the substrates being as thin as approximately 75 µm and are easily mounted in a small apparatus such as a memory card, are appropriate, but PCBs, semiconductor substrates or substrates within a package may be used.

In the case of FPCs, transmission lines can be formed through a printing process carried out on copper foils formed on the two surfaces of the substrates having a thickness of approximately 30 µm and the vias that make wiring through the substrate possible. The characteristic impedance of the transmission lines is generally 50 Ω and is set to the value of a coupling impedance.

The distance for communication is approximately 1 mm in the case where an application for the data communication between a memory card and a PC is assumed. In addition, though FIG. 1 illustrates a case where two modules $1_1$, $1_2$ are in close proximity, the number of modules may be three or more. Furthermore, in the case where the modules $1_1$, $1_2$ are layered on top of each other in close proximity, the two may be layered on top of each other in the same direction or may be layered on top of each other with one turned upside down so that the corresponding surfaces face each other. In the case where three or more modules are layered on top of each other, they are layered on top of each other in the same direction.

In addition, the feedback signal lines $4_1$, $4_2$ may have a coplanar structure relative to the signal lines $3_1$, $3_2$ or may form differential lines together with the signal lines $3_1$, $3_2$. In the case of differential signal lines, resistance against in-phase noise is high as compared to the case of single ends, and in addition, it is easy to control the impedance without necessarily requiring a feedback path having a coplanar structure, and therefore, the designing is easy.

Furthermore, either the distance between the signal lines $3_1$, $3_2$ or the width of the portions of the signal lines $3_1$, $3_2$ that overlap each other may be different depending on the direction in which the signals propagate when the signal lines $3_1$, $3_2$ are in the coupling state, and thus, a multinodal coupler may be provided so that the frequency characteristics of the coupling coefficient of the signal lines $3_1$, $3_2$ can be made flat and a broadband coupler can be implemented.

Moreover, the signal lines $3_1$, $3_2$ and the semiconductor integrated circuit apparatuses $6_1$, $6_2$ may be connected directly to each other or may be connected using leading transmission lines of which the width is narrower than that of the signal lines $3_1$, $3_2$. It is desirable for the coupling between the leading transmission lines to be weak, and therefore, it is desirable for the distance over which the two face each other to be greater than the distance over which the signal lines $3_1$, $3_2$ face each other or for the two to overlap less when projected, and as a result, the coupling impedance of the transmission lines is almost the same as the characteristic impedance $Z_0$ of the single transmission lines, and therefore, the designing is easy.

As described above, in the mode of the present invention, the band of the communication channels can be made broader (10 Gb/s or greater) than conventional inductive coupling, and therefore, the communication speed can be increased. In addition, the present invention can provide a structure where the impedance of the communication channel barely changes within a range of the communication band and is uniform along the length, and therefore, the impedance can be matched at the connection point with the transmitting and receiving circuit, and termination is possible with the matched register so that an integrated circuit having a transmitter and receiver at a distance away from the communication channel can be arranged, and therefore, the freedom in designing is increased. In addition, more channels can be arranged so as to be connected, and therefore, the communication speed can be increased.

In another field to which the present invention can be applied, wireless data communication is made possible without using a wire connection through a conventional connector or backplate when a number of circuit boards are arranged so as to be aligned in the upward and downward directions. Alternatively, the invention can be used for wireless data communication between a module that rotates within an apparatus and a module that is fixed nearby.

First Embodiment

Figure 2:
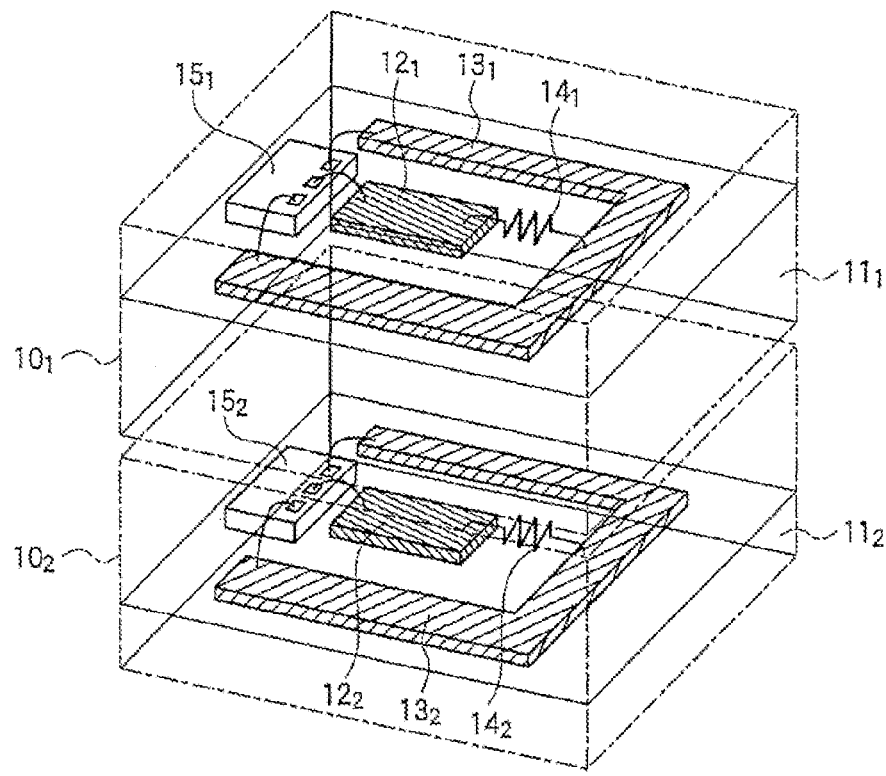
FIG. 2 is a schematic perspective diagram showing the inter-module communication apparatus according to the first embodiment of the present invention.
Figure 3:
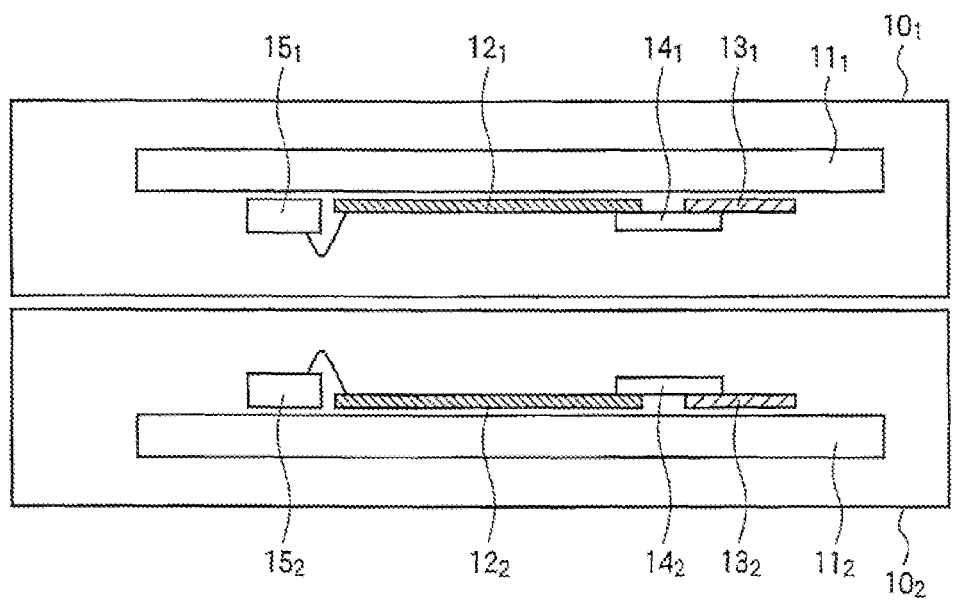
FIG. 3 is a cross-sectional diagram showing the inter-module communication apparatus according to the first embodiment of the present invention.

Presupposing the above, the inter-module communication apparatus according to the first embodiment of the present invention is described next in reference to FIGS. 2 to 6. FIG. 2 is a schematic perspective diagram showing the inter-module communication apparatus according to the first embodiment of the present invention, and FIG. 3 is a cross-sectional diagram showing the same. Transmission line couplers are formed of rectangular signal lines $12_1$, $12_2$ having a length L (typically 5 mm) and a width W (typically 2 mm). Signal feedback paths (return paths) $13_1$, $13_2$, which are coplanar transmission lines, are installed nearby the transmission line couplers. The signal lines $12_1$, $12_2$ and the feedback paths $13_1$, $13_2$ are formed by processing a copper foil having a thickness of approximately 30 μm formed on the surface of FPC substrates $11_1$, $11_2$.

The impedance (the ratio of a voltage to a current) of the transmission lines has a constant value without depending on the location along the line or barely depending on the frequency within the target signal band. The value of the characteristic impedance $Z_0$ for exhibiting the characteristics of the transmission line is determined by the layout of the signal lines $12_1$, $12_2$ and the feedback paths $13_1$, $13_2$, and thus is determined by the dielectric constant and the permeability of the substrates $11_1$, $11_2$.

When the two modules $10_1$, $10_2$ are in close proximity, however, the impedance of a signal line $12_1$ or $12_2$ is affected by the other signal line $12_2$ or $12_1$ through the proximity effects, and thus has a value different from $Z_0$. The closer the two modules $10_1$, $10_2$ are, the greater the proximity effects are and the smaller the impedance of the signal lines $12_1$, $12_2$ is.

In the present specification, the impedance of the signal lines $12_1$, $12_2$ that are in the coupling state is referred to as coupling impedance, which is denoted by $Z_{0\text{-}coupled}$. The characteristic impedance $Z_0$ is controlled according to the prior art from which the present invention is essentially different in that the coupling impedance $Z_{0\text{-}coupled}$ is controlled.

Semiconductor integrated circuit apparatuses $15_1$, $15_2$ having a transmitter and receiver for transmitting and receiving a digital signal after signal processing are installed close to the signal lines $12_1$, $12_2$, for example, at a distance of 0.4 mm or less, in the case where the digital signal is transmitted at 10 Gb/s. The output or input impedance of the transmitter and receiver is matched with the impedance of the signal lines $12_1$, $12_2$ using a resistor that is equal to the coupling impedance $Z_{0\text{-}coupled}$ (installed within the semiconductor integrated circuit apparatuses $15_1$, $15_2$, not shown). In addition, the impedance is matched between the other end of the signal lines $12_1$, $12_2$ and the feedback paths $13_1$, $13_2$ through termination using resistors $14_1$, $14_2$ that are equal to the coupling impedance $Z_{0\text{-}coupled}$.

Controlling the impedance can be achieved by adjusting the transconductance $g_m$ of the transistor instead of the resistor. The transconductance $g_m$ can be changed in accordance with the voltage between the gate and the source of the transistor, the current flowing through the drain, and the form of the channel of the transistor (hereinafter a case where the transconductance of the transistor is used is included in the case where a resistor is used in the descriptions and illustrations).

As a result of the coupling between transmission lines, when a current corresponding to a signal flows through one transmission line $12_1$ or $12_2$, a current flows through the other signal line $12_2$ or $12_1$ in the same or opposite direction so that a signal is transmitted.

There are cases where the two modules $10_1$, $10_2$ are both installed and fixed so that communication is always possible, and communication is possible only when the modules move so as to shorten the distance. Examples of the former include communication between packages and communication between boards. Examples of the latter include non-contact memory cards, probe apparatuses for probing through the package, and data communication with a rotating portion. The module is sealed with plastic or the like, and an adhesive resin may be placed or a space may be made between the two modules.

The surfaces on which the signal lines $12_1$, $12_2$ are installed may be the surfaces of the FPC substrates $11_1$, $11_2$ that face each other or that face away from each other. FIG. 2 shows a case where the signal lines are installed on the surfaces that face away from each other, and FIG. 3 shows a case where the signal lines are installed on the surfaces that face each other. In either case, there is a dielectric body (typical relative dielectric constant is 3 to 5) and a space (relative dielectric constant is 1) between the transmission line couplers that are coupling.

Figure 4A:
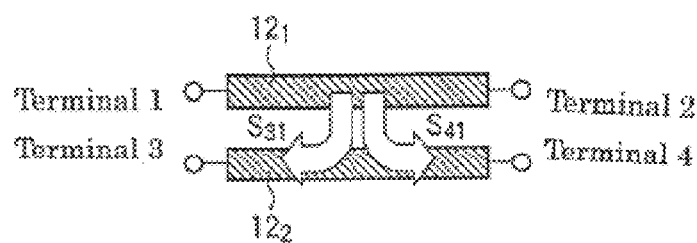
FIGS. 4(a) and 4(b) are a diagram and a graph for illustrating the frequency characteristics of the coupler according to the first embodiment of the present invention.
Figure 4B:
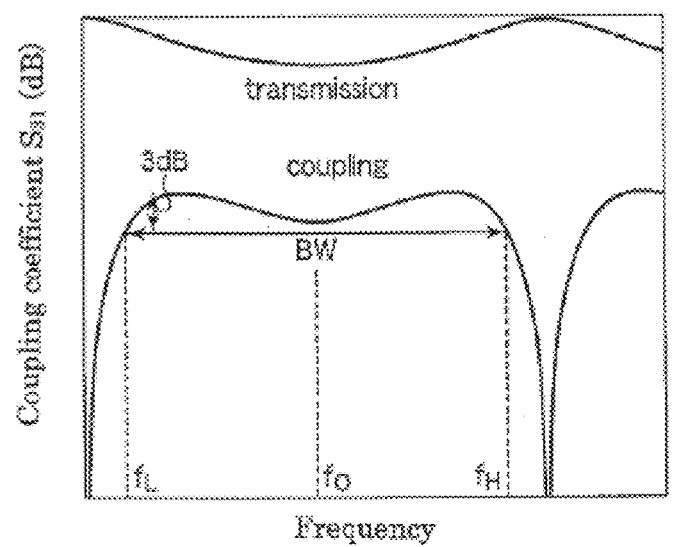

FIGS. 4(a) and 4(b) are a diagram and a graph for illustrating the frequency characteristics of the coupler according to the first embodiment of the present invention. As shown in FIG. 4(a), the two terminals of one signal line $12_1$ are terminal 1 and terminal 2, and the two terminals of the other signal line $12_2$ are terminal 3, which is on the same side as terminal 1, and terminal 4, which is on the opposite side of terminal 1. A case is assumed where terminal 2 and terminal 4 are terminated, a signal is inputted through terminal 1, and a signal is outputted through terminal 3.

FIG. 4(b) shows a typical example of the frequency characteristic $S_{31}$ of the communication channel in which signals are transmitted through transmission line coupling. When the frequencies of which the coupling intensity is lower than the maximum by 3 dB are denoted by $f_L$ and $f_H$, the center frequency $f_0$ between $f_L$ and $f_H$ can be represented by the following formula (1) when λ is the wavelength of the signal and v is the speed of the signal.

[Formula 1]

$$f_0 = \frac{v}{\lambda/4} \quad (1)$$

The wavelength of a 1.0 GHz signal is approximately 1.4 mm in the dielectric body having a relative dielectric constant of 4, and therefore, $\lambda/4$ is approximately 3.7 mm. The frequency and the wavelength are inversely proportional, and therefore, $\lambda/4$ is 5 mm when the frequency is approximately 7 GHz. In the transmission line coupling, the length L of the transmission line coupler is designed so as to be ¼ of the wavelength ($\lambda/4$), and therefore, $f_0=7$ GHz when L=5 mm, and $f_0=5$ GHz when L=7 mm.

In addition, the coupling intensity in the frequency region between the frequencies $f_H$ and $f_L$ of which the coupling intensity is lower than the maximum by 3 dB barely depends on the frequency, and a signal can be transmitted without the signal waveform being changed, and therefore, this region is used as a signal band. $f_L$ is approximately $0.5 \times f_0$, and $f_H$ is approximately $14 \times f_0$, and therefore, the signal band $f_H$-$f_L$ is approximately $f_0$. The signal speed is proportional to the signal band, and therefore, the smaller the transmission line length (L) is, the broader the band is, and thus, high speed communication is possible. As described above, the length L of the transmission line coupler is determined from the requirements of the signal band.

In the case where the coupling intensity is not sufficiently high, the signal noise ratio cannot be made large, which cannot make highly reliable communication possible. The absolute value C (decibel value) of the voltage signal attenuation is given in the following formula (2).

[Formula 2]

$$C = -20\log\left|\frac{Z_{0e} - Z_{0o}}{Z_{0e} + Z_{0o}}\right| \quad (2)$$

Here, $Z_{0e}$ is the characteristic impedance of the transmission line pair in an even-numbered mode, and $Z_{0o}$ is the characteristic impedance of the transmission line pair in an odd-numbered mode.

When two signal lines $12_1$ and $12_2$ are coupled, the signals that flow through the two transmission lines can be expressed as a synthesis of signals directed in the same direction (the two change from low to high, for example) and signals in opposite directions (when one changes from low to high, the other changes from high to low). That is to say, the signals $V_1$ and $V_2$ in lines 1 and 2 can be represented by $V_1=V_{even}+0.5 V_{odd}$, $V_2=V_{even}-0.5 V_{odd}$, where $V_{odd}=V_1-V_2$, $V_{even}=0.5 (V_1+V_2)$ when the signal component that propagates in an even-numbered mode is $V_{even}$ and the signal component that propagates in an odd-numbered mode is $V_{odd}$.

The coupling impedance of the transmission line pair for in-phase signals is referred to as even-numbered mode impedance ($Z_{0e}$), and the coupling impedance of the transmission line for reverse phase signals is referred to as an odd-numbered mode impedance ($Z_{0o}$). In an even-numbered mode, signals change in in-phase, and therefore, the capacitance between the lines is effectively reduced as compared to an odd-numbered mode where signals change in reverse phase.

The impedance is inversely proportional to the capacitance, and therefore, the even-numbered mode impedance ($Z_{0e}$) is greater than the odd-numbered mode impedance ($Z_{0o}$). Since $(Z_{0e}-Z_{0o})/(Z_{0e}+Z_{0o})$ is a value of 1 or less, the greater this difference is, the smaller the value of C is and the stronger the coupling intensity is. In addition, the coupling impedance $Z_{0\text{-}coupled}$ is determined from $Z_{0e}$ and $Z_{0o}$ as in the following formula (3).

[Formula 3]

$$Z_{0\text{-}coupled} = \sqrt{Z_{0e} Z_{0o}} \quad (3)$$

The terminals of the signal lines $12_1$, $12_2$ are terminated by a resistor that is equal to the coupling impedance $Z_{0\text{-}coupled}$ or are connected to a transmission line having the characteristic impedance $Z_0$ that is equal to the coupling impedance $Z_{0\text{-}coupled}$ so that the impedance can be matched, and thus, the dimensions of the coupler are designed while suppressing the reflection of signals so that the coupling intensity becomes great.

Figure 5A:
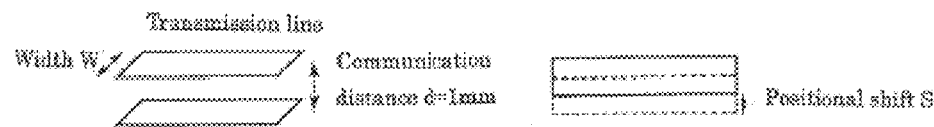
FIGS. 5(a) to 5(c) are a diagram and graphs for illustrating the relationship between the size of the coupler and the properties of the coupler according to the first embodiment of the present invention.
Figure 5B:
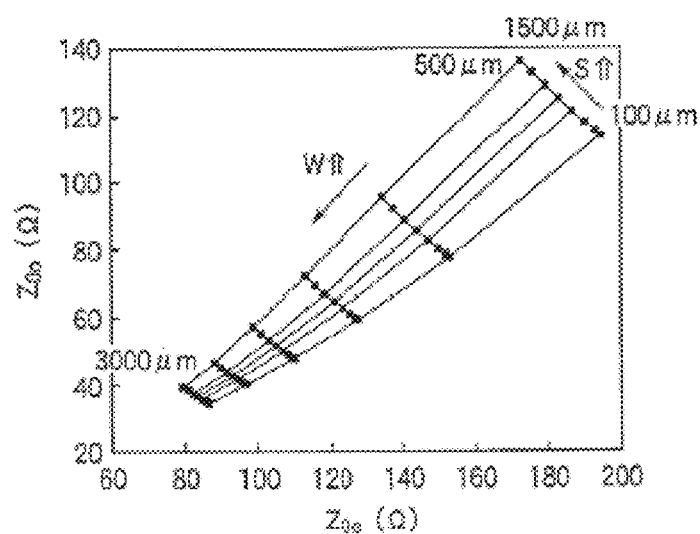
Figure 5C:
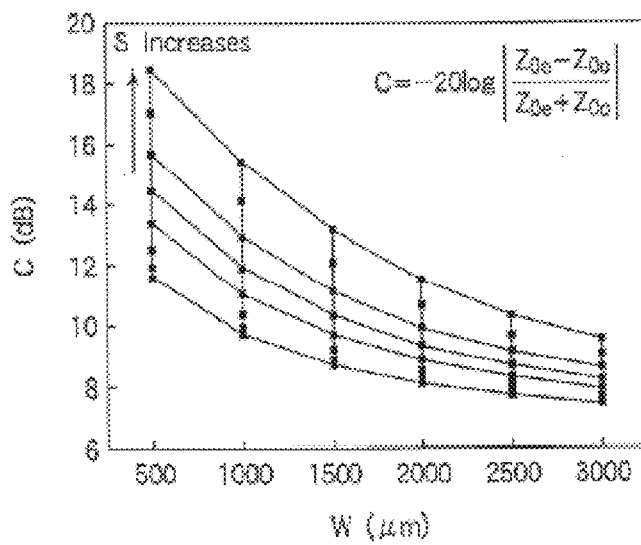

FIGS. 5(a) to 5(c) show the examinations of these relationships using an electromagnetic field analysis simulator. FIG. 5(a) is a diagram for illustrating signal lines having a width W, a distance d, and a positional shift S. FIG. 5(b) is a graph for illustrating the dependency of $Z_{0o}$ and $Z_{0e}$ on the line width W and the positional shift S. FIG. 5(c) is a graph for illustrating the dependency of the correlation between the voltage signal attenuation C and the line width W on the positional shift S. The frequency characteristics of the coupler change depending on the line width W in such a manner that the greater W is, the stronger the coupling is. Though the more the positions of the transmission lines shift the weaker the coupling is, the coupling intensity lowers only by approximately 3 dB (that is to say, becomes half) even when the transmission lines shift by approximately half of the width (S=1.5 mm when W=3 mm, for example).

Here, the impedances $Z_{0o}$, $Z_{0e}$ in the even-numbered and the odd-numbered modes are respectively determined by the capacitance and the inductance between the signal line $12_1$ and the feedback path $13_1$, the capacitance and the inductance between the signal line $12_2$ and the feedback path $13_2$ as well as the capacitance and the conductance between the signal line $12_1$ and the signal line $12_2$. At this time, the even-numbered mode impedance and the odd-numbered mode impedance of the coupled transmission lines are not clearly defined without the signal reference potential being set when the coupling between the feedback path $13_1$ and the feedback path $13_2$ is weak. As a result, these impedances greatly fluctuate under the conditions for actual use, and thus, the terminating process becomes difficult.

In order to avoid this problem, coupling that is as strong as or stronger than the coupling between the signal lines $12_1$ and $12_2$ is required between the feedback path $13_1$ and the feedback path $13_2$.

Figure 6:
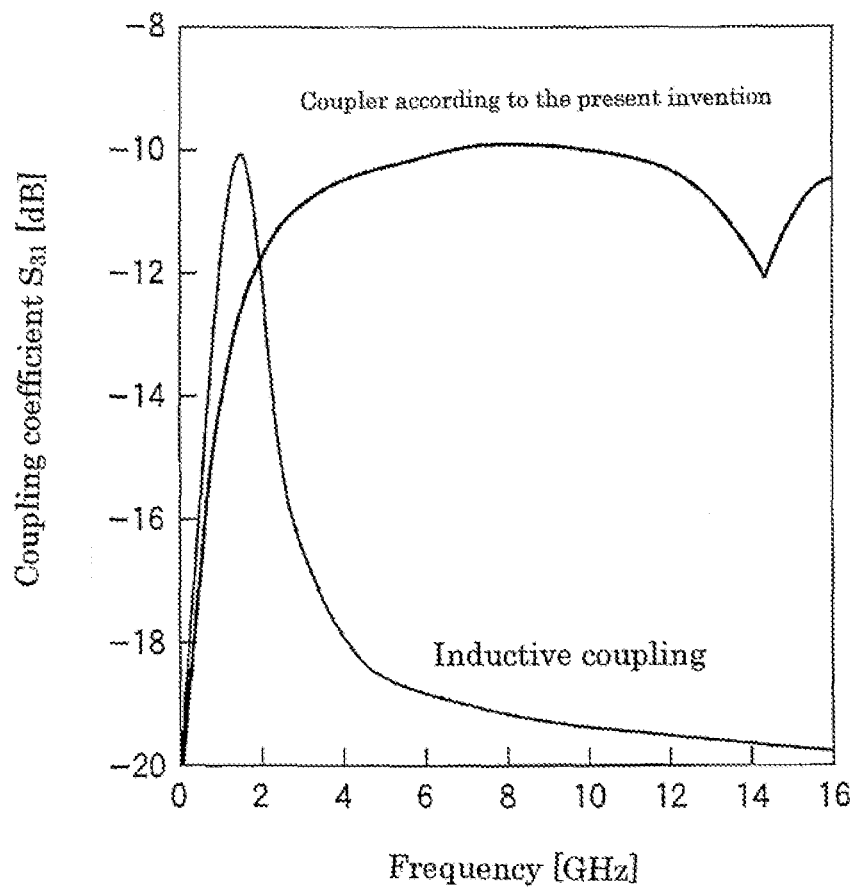
FIG. 6 is a graph for illustrating the results of simulation of the electromagnetic field analysis in the first embodiment of the present invention.

In the first embodiment of the present invention, the impedance is matched on the basis of the coupling impedance $Z_{0\text{-}coupled}$, and therefore, the reflection of signals is reduced and high speed communication is made possible, and at the same time, a wireless communication path of which the band is broader than in the case of only inductive coupling using a coil can be realized as shown in FIG. 6.

Second Embodiment

Figure 7:
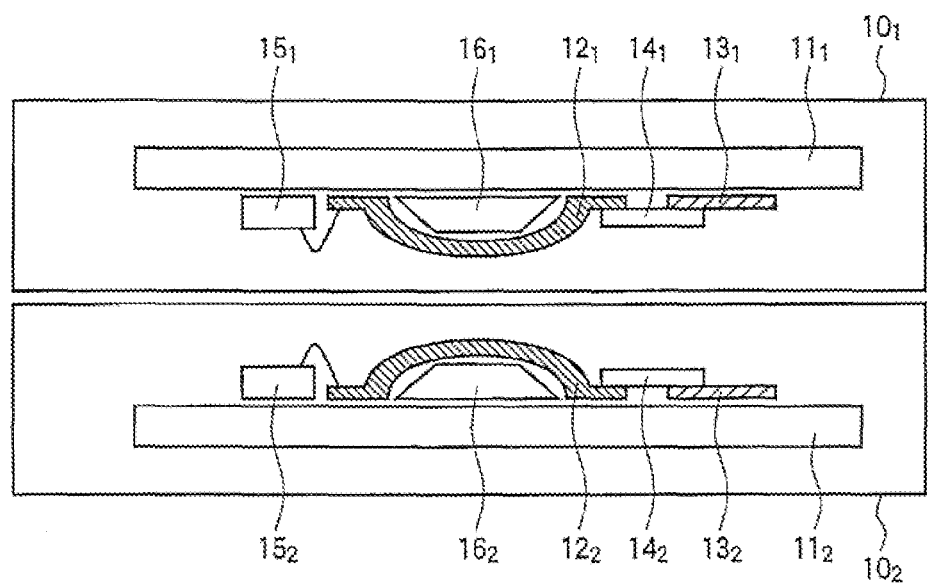
FIG. 7 is a schematic cross-sectional diagram showing the inter-module communication apparatus according to the second embodiment of the present invention.

Next, the inter-module communication apparatus according to the second embodiment of the present invention is described in reference to FIG. 7. FIG. 7 is a schematic cross-sectional diagram showing the inter-module communication apparatus according to the second embodiment of the present invention having such a structure that protruding members $16_1$, $16_2$ are provided on substrates $11_1$, $11_2$ and signal lines $12_1$, $12_2$ are provided so as to go over the protruding members $16_1$, $16_2$, and the remaining portions of the structure are the same as in the above-described first embodiment. Here, the protruding members $16_1$, $16_2$ are formed of an ultraviolet ray curing resin, for example.

Since the signal lines $12_1$, $12_2$ that form the coupler are curved, the distance between the signal lines $12_1$ and $12_2$ gradually changes in such a manner that the two are the closest at the center of the coupler where the coupling capacitance between the lines is the greatest. As a result, the difference between the even-numbered mode impedance $Z_{0e}$ and the odd-numbered mode impedance $Z_{0o}$ becomes great, making the coupling intensity great.

As a result of an increase in the intensity of the coupling, the signal intensity on the receiving side can be increased. In addition, the coupling intensity differs depending on the location, and the overlapping of these becomes the coupling coefficient $C_{total}(f)$ of the entirety of the coupling transmission lines as shown in the following formula (4).
[Formula 4]

$$C_{total}(f) \propto \int_0^L C(x)\exp(j2\pi f/v)dx \quad (4)$$

Thus, C(x), which is a function of the location, is adjusted so that $C_{total}(f)$ becomes flat, and as a result, the band of the coupling transmission lines can be increased. In the case where the substrates $11_1$, $11_2$ are flexible like FPCs, the substrates $11_1$, $11_2$ may be molded into a bowl shape.

As described above, in the second embodiment of the present invention, the coupling coefficient between transmission lines can be increased by shortening the communication distance, and thus, the S/N ratio on the receiver side can be increased. In particular, the intensity of the coupling coefficient that continuously changes is adjusted so that the frequency characteristics of the coupling coefficient of the transmission lines can be made flat, and thus, the frequency band can be widened. In addition, the impedance of the coupling transmission lines can be prevented from discontinuously changing, and thus, the terminating process becomes easy. As a result, the reliability of the signal transmission can be increased. Here, this structure can be applied to a case as described below where a feedback path forms a differential line together with a signal line.

Third Embodiment

Figure 8A:
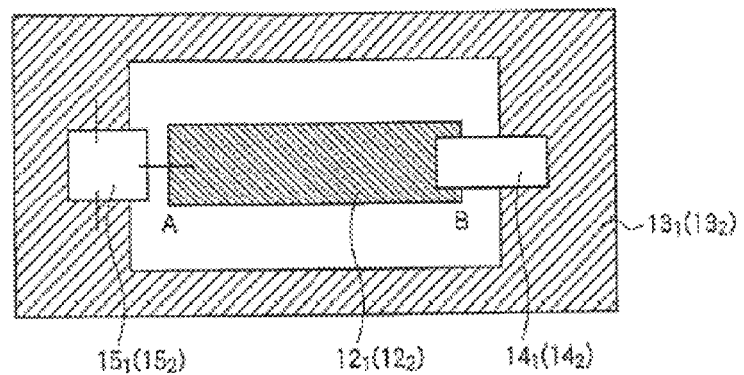
FIGS. 8(a) and 8(b) are diagrams for illustrating the structure of the inter-module communication apparatus according to the third embodiment of the present invention.
Figure 8B:
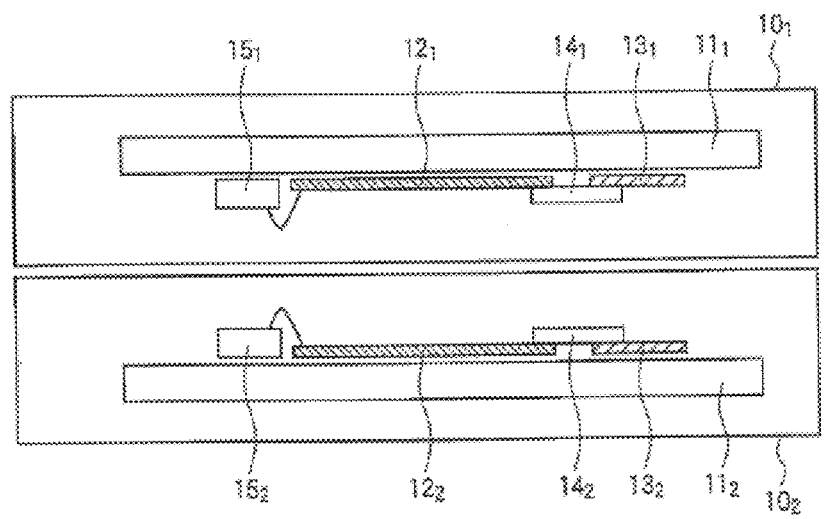

Next, the inter-module communication apparatus according to the third embodiment of the present invention is described in reference to FIGS. 8(a) and 8(b). FIG. 8(a) is a schematic plan diagram showing a single module, and FIG. 8(b) is a schematic cross-sectional diagram showing the inter-module communication apparatus according to the third embodiment of the present invention. In the third embodiment of the present invention, feedback paths $13_1$, $13_2$ are formed on the two sides, left and right, of the signal lines $12_1$, $12_2$ that run in the direction in which signals transmit through the coupler so as to be line symmetric relative to the coupler.

In the third embodiment of the present invention, the feedback paths are symmetric on the two sides of the signal lines $12_1$, $12_2$, and therefore, the currents that flow from one end A to the other end B of the signal lines $12_1$, $12_2$ pass through the feedback paths along the two sides of the signal lines $12_1$, $12_2$ so as to return in the direction from the end B to the end A, and thus, the same state is provided as in two coils having the same shape aligned side by side through which currents flow in opposite directions.

At this time, when magnetic fields having the same dimensions penetrate through these two coils as noise, this affects the noise signals that appear in the two coils so that they are directed in opposite directions so as to offset each other. Accordingly, the in-phase noise removal ratio increases and the resistance to noise increases.

Fourth Embodiment

Figure 9A:
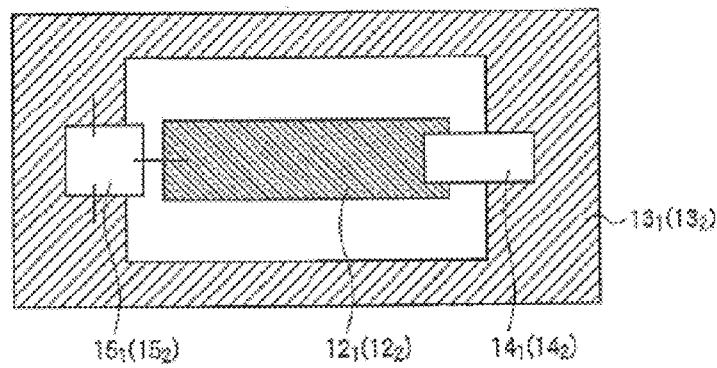
FIGS. 9(a) and 9(b) are diagrams for illustrating the structure of the inter-module communication apparatus according to the fourth embodiment of the present invention.
Figure 9B:
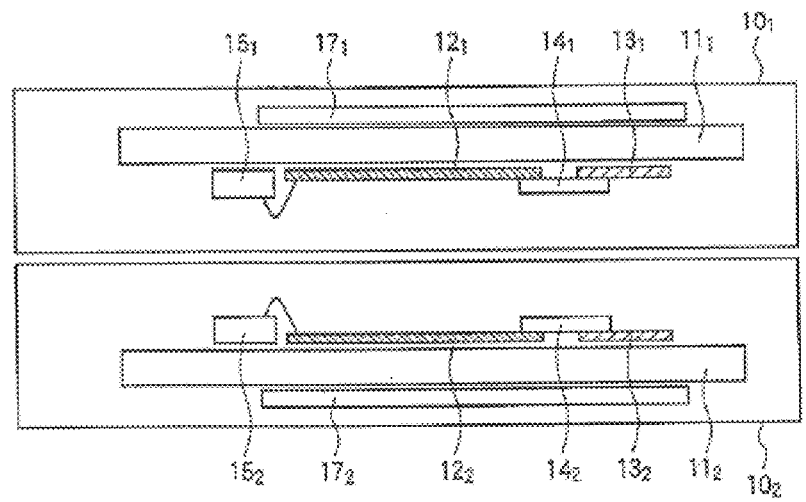

Next, the inter-module communication apparatus according to the fourth embodiment of the present invention is described in reference to FIGS. 9(a) and 9(b). FIG. 9(a) is a schematic plan diagram showing a single module, and FIG. 9(b) is a schematic cross-sectional diagram showing the inter-module communication apparatus according to the fourth embodiment of the present invention. In the fourth embodiment of the present invention, the above-described module in the third embodiment is further provided with shield layers $17_1$, $17_2$ on the rear surface of the substrates $11_1$, $11_2$ in such a manner that they contain the coupler inside. These shield layers $17_1$, $17_2$ are formed of copper foils formed on the rear surfaces of the FPC substrates $11_1$, $11_2$. Though the couplers and the semiconductor integrated circuit apparatuses $15_1$, $15_2$ are provided on the same planes, the semiconductor integrated circuit apparatuses $15_1$, $15_2$ may be provided on the opposite sides using vias.

Thus, in the fourth embodiment of the present invention, the shield layers $17_1$, $17_2$ are provided so that the shield layers $17_1$, $17_2$ can reduce electromagnetic field noise that enters into a coupler from the outside. As a result, the resistance to noise increases. Conversely, the shield layers can reduce electromagnetic noise that is radiated to the outside (that is to say, electromagnetic interference) as a result of wireless communication using the couplers. As a result, adaptability to the electromagnetic environment increases. Here, this structure can be applied to a case as described below where a feedback path forms a differential line together with a signal line.

Fifth Embodiment

Figure 10A:
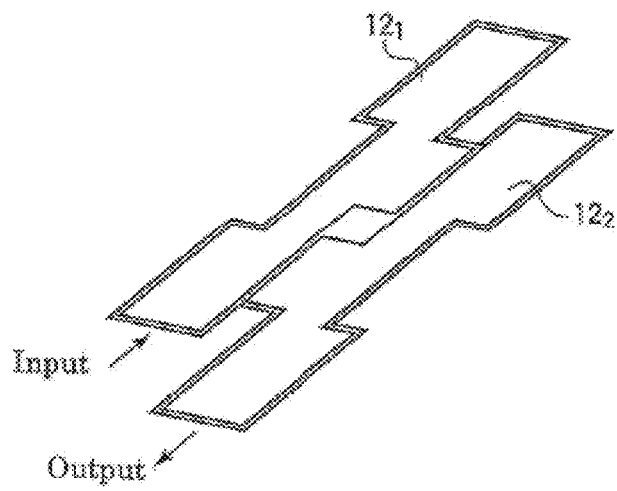
FIGS. 10(a) to 10(c) are diagrams for illustrating the structure of the inter-module communication apparatus according to the fifth embodiment of the present invention.
Figure 10B:
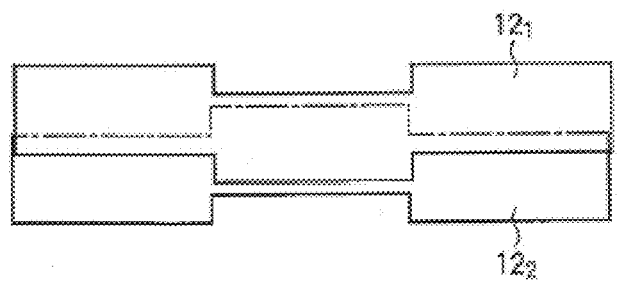
Figure 10C:
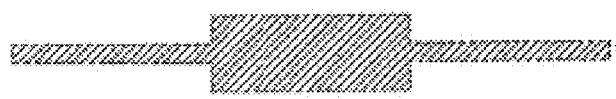
Figure 11:
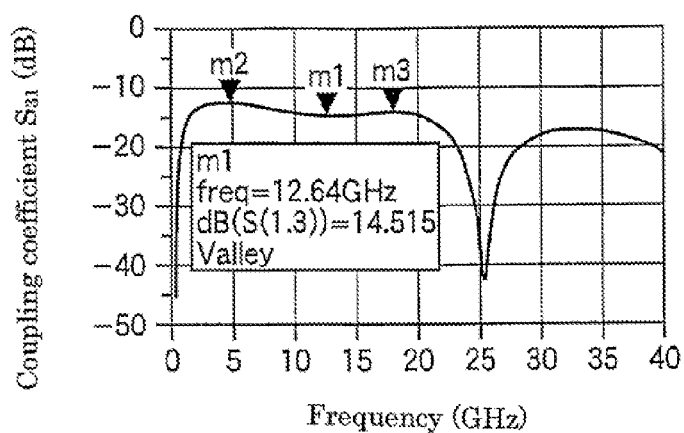
FIG. 11 is a graph for illustrating the frequency characteristics in the electromagnetic field simulation for the structure in the fifth embodiment.

Next, the inter-module communication apparatus according to the fifth embodiment of the present invention is described in reference to FIGS. 10(a) to 11. FIG. 10(a) is a schematic perspective diagram showing the coupler of the inter-module communication apparatus according to the fifth embodiment of the present invention, FIG. 10(b) is a schematic plan diagram, and FIG. 10(c) is a diagram illustrating the coupling portion.

The frequency characteristics of the coupler are changed by changing the line width of the transmission line coupler. Therefore, a coupler with a broader band can be realized by changing the line width of the signal lines $12_1$, $12_2$ instead of keeping them uniform. That is to say, a number of couplers having different widths may be connected so as to be multi-nodal. When the line width is changed, however, it is difficult to control the impedance of the line to have a constant value and multiple reflections of signals take place. Therefore, in the fifth embodiment of the present invention, the transmission line coupler is bent so that the line width is kept constant with the impedance being controlled to be constant, while the signal lines $12_1$, $12_2$ overlap with the connection portions, providing multiple nodes and different line widths.

FIG. 11 is a graph for illustrating the frequency characteristics of the structure in the fifth embodiment using electromagnetic field simulation, where a signal band of 12.6 GHz and the coupling intensity $S_{31}$ of −14.5 dB can be implemented. Thus, the coupling capacitance between the lines is greater in locations where the overlapping portion is greater in the case of a multinodal structure. As a result, the difference between the even-numbered mode and the odd-numbered mode impedances $Z_{0e}$, $Z_{0o}$ increases and the coupling intensity C increases.

When the coupling intensity in the nth node is Cn, the intensity of the signal that is transmitted to the receiving end through the coupling in this node can be represented by the following formula (5), taking the change in the phase into consideration.

[Formula 5]

$$\frac{V_{RX}}{V_{TX}} = j\sin(\theta) \cdot C_n \exp(-j(1+2n)\theta) \quad (5)$$

Here, $\theta=2$ Lf/v, where the length of each node is L, the signal speed is v, and the frequency is f.

The coupling coefficient $C_{total}$ of the entirety is the overlapping of the signals transmitted to the receiving ends from each node, and therefore can be represented by the following formula (6).

[Formula 6]

$$C_{total}(f) = j\sin\theta \Sigma C_n \exp(-j(1+2n)\theta) \quad (6)$$

Thus, the coupling intensity of the respective nodes is adjusted so that $C_{total}(f)$ becomes flat, and thus, the band of the coupled transmission lines can be widened. The same logic can be applied to a case where curved transmission lines are formed in order to prevent signal reflection, and the frequency characteristics of the coupling coefficient can be made flat so that a coupler with a broadband can be realized.

Thus, in the fifth embodiment of the present invention, the signal lines $12_1$, $12_2$ have multiple nodes, and therefore, a coupled communication path with a broader band can be realized as compared to a coupler with a single node. Here, this structure can be applied to a case where the feedback path forms a differential line together with a signal line as described below.

Sixth Embodiment

Figure 12A:
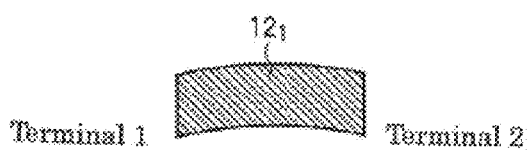
FIGS. 12(a) to 12(c) are diagrams for illustrating the structure of the inter-module communication apparatus according to the sixth embodiment of the present invention.
Figure 12B:
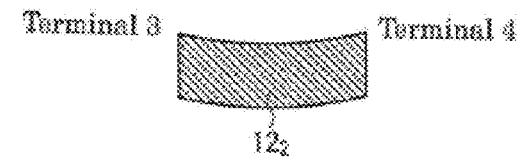
Figure 12C:
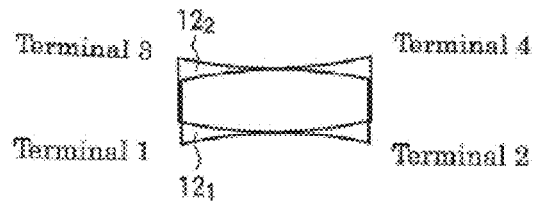

Next, the inter-module communication apparatus according to the sixth embodiment of the present invention is described in reference to FIGS. 12(a) to 12(c). FIG. 12(a) is a schematic plan diagram showing one signal line of the inter-module communication apparatus according to the sixth embodiment of the present invention, FIG. 12(b) is a schematic plan diagram showing the other signal line, and FIG. 12(c) is a diagram for illustrating the coupling portion.

As shown in FIGS. 12(a) and 12(b), in the sixth embodiment of the present invention. The signal lines $12_1$, $12_2$ are curved in order to greatly increase the number of nodes in accordance with another method for realizing a multinodal coupler.

Thus, in the sixth embodiment of the present invention, the coupling portion continuously and gradually changes so that there are few dramatic changes in the impedance, and therefore, the band can further be widened. Here, this structure can be applied to a case where the feedback path forms a differential line together with a signal line as described below.

Seventh Embodiment

Figure 13:
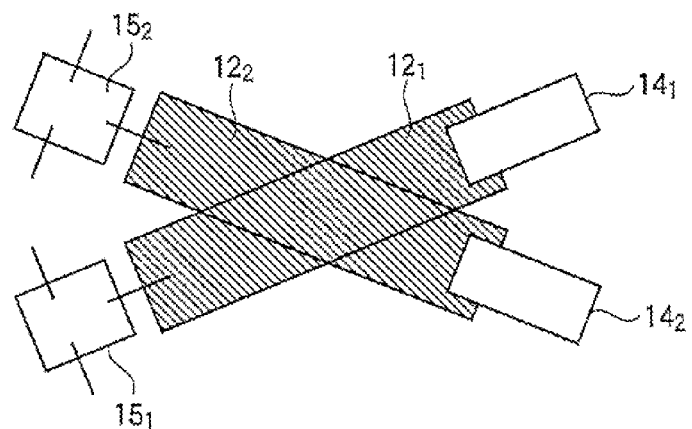
FIG. 13 is a schematic plan diagram showing a projection of the inter-module communication apparatus according to the seventh embodiment of the present invention.

Next, the inter-module communication apparatus according to the seventh embodiment of the present invention is described in reference to FIG. 13. FIG. 13 is a schematic plan diagram showing the projection of the inter-module communication apparatus according to the seventh embodiment of the present invention. As shown in FIG. 13, signal lines $12_1$, $12_2$ cross each other so as to form a coupler at the intersection.

When signal lines $12_1$, $12_2$ having a constant width and a uniform impedance diagonally cross each other, the width of the intersection becomes wider at the center of the intersection and narrower on the two sides, and therefore, a broadband is provided in the same manner as in the above-described fifth embodiment. Furthermore, the shape of the intersection is constant even in the case where the signal lines $12_1$, $12_2$ positionally shift away from each other in any direction in the plane, and therefore, there are such effects that the coupling characteristics are constant irrelevant of the positional shifting of the modules.

Thus, in the seventh embodiment of the present invention, the signal lines $12_1$, $12_2$ are arranged so as to diagonally cross each other, and therefore, a wireless communication line with a broadband can be realized. In addition, this has such features that the characteristics of the communication line do not change even in the case where the modules $10_1$, $10_2$ positionally shift away from each other. Here, this structure can be applied to a case where the feedback path forms a differential line together with a signal line as described below.

Eighth Embodiment

Figure 14:
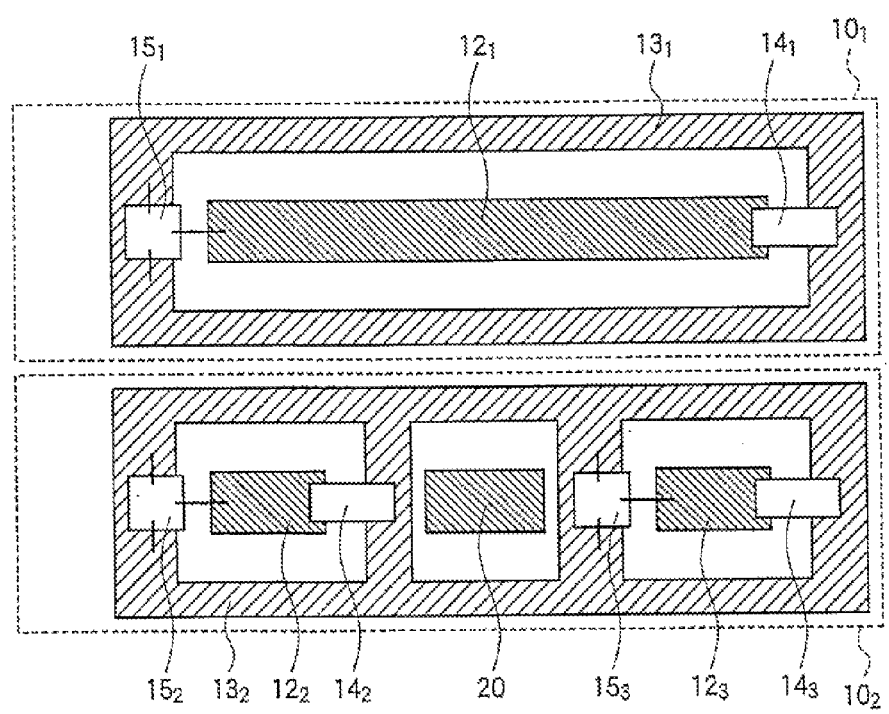
FIG. 14 is a diagram for illustrating the inter-module communication apparatus according to the eighth embodiment of the present invention.

Next, the inter-module communication apparatus according to the eighth embodiment of the present invention is described in reference to FIG. 14. FIG. 14 is a diagram for illustrating the inter-module communication apparatus according to the eighth embodiment of the present invention and shows two modules in a plan view. As shown in the figure, one signal line $12_1$ provided in one module $10_1$ and a number of signal lines $12_2$, $12_3$ provided in the other module $10_2$ are coupled.

Signals transmitted from the semiconductor integrated circuit apparatus $15_1$ in the module $10_1$ can be simultaneously transmitted to the semiconductor integrated circuit apparatus $15_2$ and the semiconductor integrated circuit apparatus $15_3$ in the module $10_2$. In this case, a coupler that is not connected to a semiconductor integrated circuit apparatus, that is to say, a dummy coupler 20, is provided in a location that is not used for the coupling so that the impedance of the signal line $12_1$ can be made constant and the control of the coupling impedance $Z_{0\text{-}coupled}$ can be made easy. Though two couplers are provided in module $10_2$ in the figure, three or more couplers may be provided.

Thus, in the eighth embodiment of the present invention, a number of couplers are provided in one module, and therefore, coupling communication with a number of branches can be realized with one transmission line so that data communication is possible from one semiconductor integrated circuit chip to a number of semiconductor integrated circuit chips. Here, this structure can be applied to a case where the feedback path forms a differential line together with a signal line as described below.

Ninth Embodiment

Figure 15:
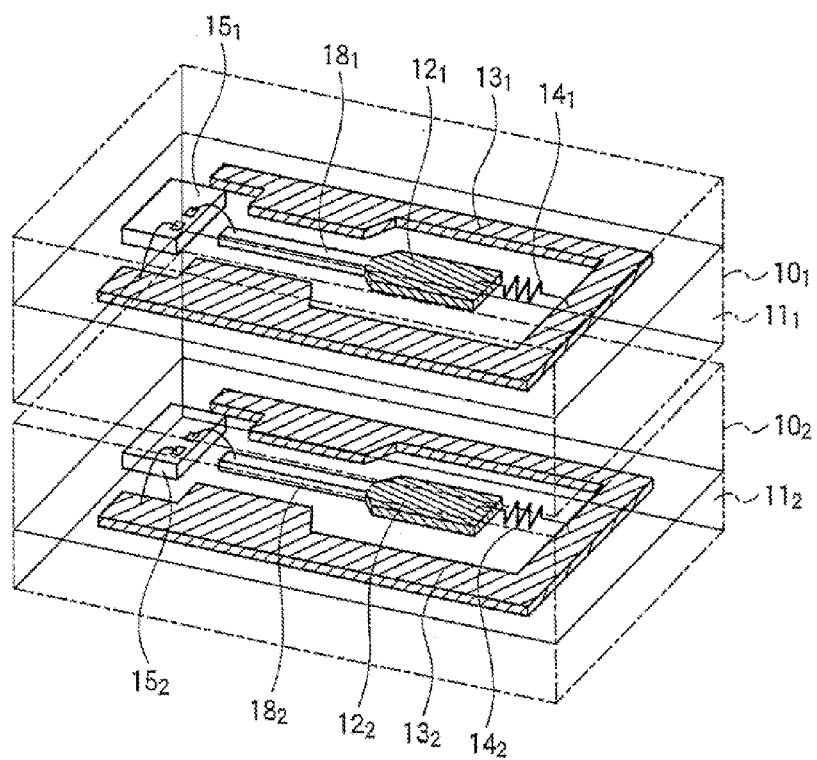
FIG. 15 is a schematic perspective diagram showing the inter-module communication apparatus according to the ninth embodiment of the present invention.

Next, the inter-module communication apparatus according to the ninth embodiment of the present invention is described in reference to FIG. 15. FIG. 15 is a schematic perspective diagram showing the inter-module communication apparatus according to the ninth embodiment of the present invention. The signal lines $12_1$, $12_2$ and the semiconductor integrated circuit apparatuses $15_1$, $15_2$ are connected through the transmission lines $18_1$, $18_2$ having a characteristic impedance $Z_0$ that is equal to the coupling impedance $Z_{0\text{-}coupled}$ of the signal lines $12_1$, $12_2$. It is desirable for strong coupling to be achieved in the coupling portions of the signal lines $12_1$, $12_2$ and for the portions in the leading transmission lines $18_1$, $18_2$ for connecting the semiconductor integrated circuit apparatuses $15_1$, $15_2$ to the signal lies $12_1$, $12_2$ not to have coupling.

In order to do this, the transmission lines $18_1$, $18_2$ have a line width narrower than the coupling portion. Typically, the line width of the signal lines $12_1$, $12_2$ is 2 mm while the line width of the transmission lines $18_1$, $18_2$ is 0.3 mm. It is desirable for the coupling portions between the transmission lines $18_1$, $18_2$ and the signal lines $12_1$, $12_2$ to be tapered so as to gradually reduce the difference in the line width in order to prevent the impedance from being greatly unmatched. In addition, the coupling impedance of the signal lines $12_1$, $12_2$ and the characteristic impedance of the transmission lines $18_1$, $18_2$ are matched, and as a result, the shape of the feedback paths $13_1$, $13_2$ is also different from that in the first embodiment.

In the case where there is no coupling at all between the leading transmission lines $18_1$, $18_2$ in the two modules $10_1$, $10_2$, the coupling impedance $Z_{0\text{-}coupled}$ of the leading transmission lines $18_1$, $18_2$ is equal to the characteristic impedance $Z_0$. In this case, the characteristic impedance $Z_0$ of the signal lines $12_1$, $12_2$ is designed to be higher than 50 Ω, and the characteristic impedance $Z_0$ of the leading transmission lines $18_1$, $18_2$ is designed to be 50 Ω when the coupling impedance $Z_{0\text{-}coupled}$ of the signal lines $12_1$, $12_2$ is 50 Ω, for example.

Alternatively, when there is slight coupling between the leading transmission lines $18_1$, $18_2$ in the two modules $10_1$, $10_2$, the characteristic impedance thereof is designed to be slightly higher than 50 Ω, for example, 55 Ω, in order to set the coupling impedance $Z_{0\text{-}coupled}$ of the leading transmission lines $18_1$, $18_2$ to 50 Ω.

In the above-described first embodiment, the semiconductor integrated circuit apparatuses $15_1$, $15_2$ having a transmitter and a receiver must be installed in proximity to the signal lines $12_1$, $12_2$ (within 0.4 mm, for example). In the ninth embodiment of the present invention, however, the leading transmission lines $18_1$, $18_2$ are provided so that the semiconductor integrated circuit apparatuses $15_1$, $15_2$ having a transmitter and a receiver can be installed in a location away from the signal lines $12_1$, $12_2$, and therefore, the freedom in designing increases.

In addition, the impedance matches between the semiconductor integrated circuit apparatuses $15_1$, $15_2$, the transmission lines $18_1$, $18_2$ and the signal lines $12_1$, $12_2$ at their terminals, and therefore, no reflection of signals occurs and high speed communication is possible with high reliability.

Tenth Embodiment

Figure 16A:
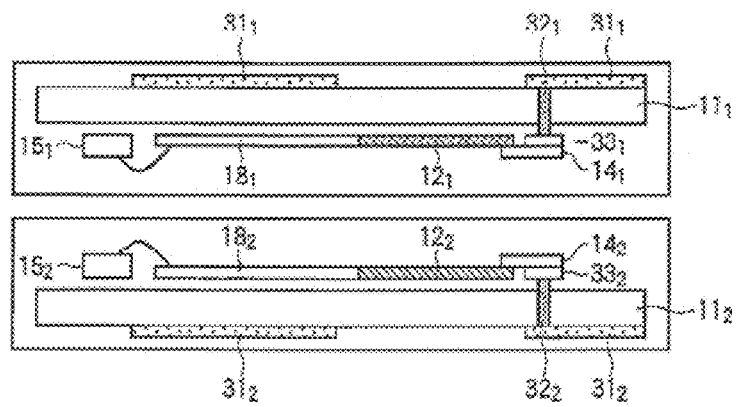
FIGS. 16(a) to 16(d) are diagrams for illustrating the structure of the inter-module communication apparatus according to the tenth embodiment of the present invention.
Figure 16B:
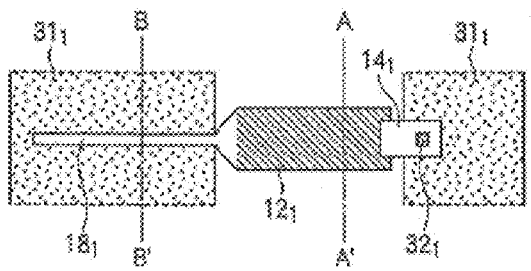
Figure 16C:
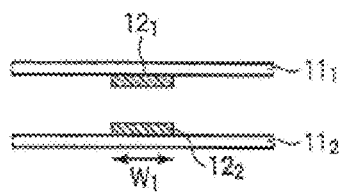
Figure 16D:
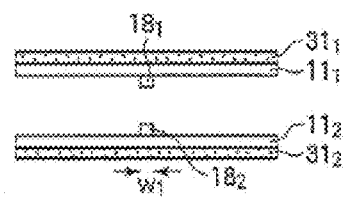

Next, the inter-module communication apparatus according to the tenth embodiment of the present invention is described in reference to FIGS. 16(a) to 16(d). FIG. 16(a) is a schematic cross-sectional diagram showing the inter-module communication apparatus according to the tenth embodiment of the present invention, FIG. 16(b) is a schematic plan diagram, FIG. 16(c) is a cross-sectional diagram along single-dotted chain line A-A' in FIG. 16(b), and FIG. 16(d) is a cross-sectional diagram along single-dotted chain line B-B' in FIG. 16(b).

In the tenth embodiment, a microstrip structure is adopted instead of the coplanar structure in the ninth embodiment, and plates $31_1$, $31_2$ are provided on the rear surface of the substrates $11_1$, $11_2$ and connected to resistors $14_1$, $14_2$ through vias $31_1$, $32_2$ and lands $33_1$, $33_2$.

In this case, the portions of the signal lines $12_1$, $12_2$ that form a coupler do not overlap the plates $31_1$, $31_2$ so that electric lines of force can be concentrated between the wires in the coupler, and thus, the coupling strength of the coupler can be increased. Here, these plates $31_1$, $31_2$ are generally grounded plates, but it is not necessary for them to be grounded.

As shown in FIGS. 16(c) and 16(d), the width $W_1$ of the signal lines $12_1$, $12_2$ is narrower than the width $w_1$ of the transmission lines $18_1$, $18_2$, and therefore, as described in detail in the twenty-third embodiment below, the coupling strength of the coupler can be increased.

Eleventh Embodiment

Figure 17:
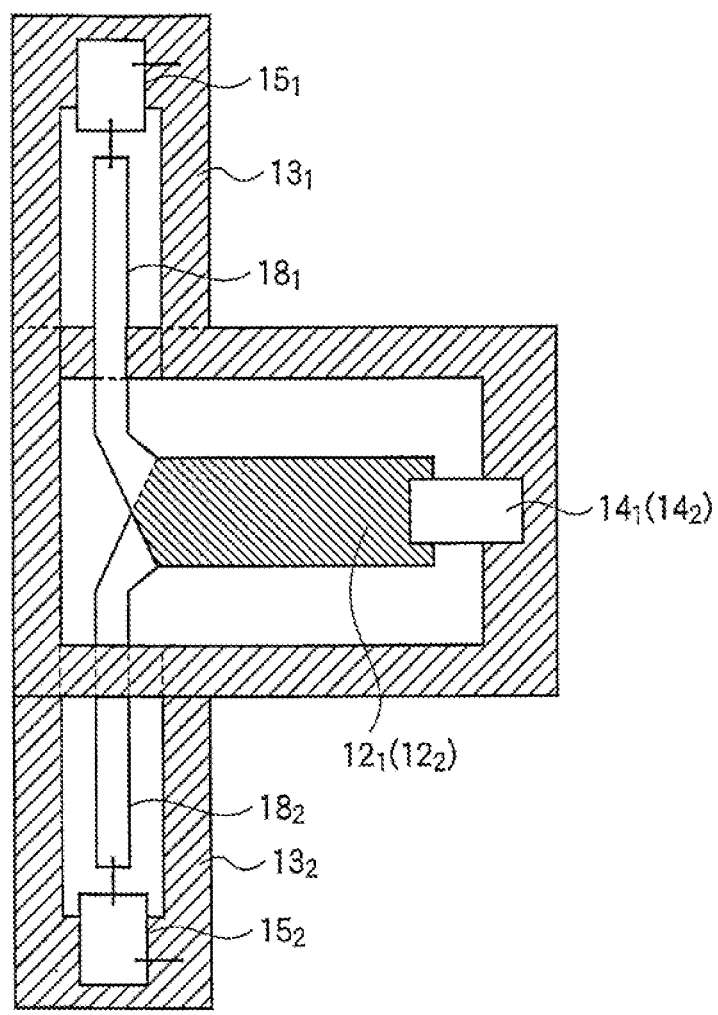
FIG. 17 is a schematic plan diagram showing a projection of the inter-module communication apparatus according to the eleventh embodiment of the present invention.

Next, the inter-module communication apparatus according to the eleventh embodiment of the present invention is described in reference to FIG. 17. FIG. 17 is a schematic plan diagram showing the projection of the inter-module communication apparatus according to the eleventh embodiment of the present invention. As shown in the figure, the leading transmission lines $18_1$, $18_2$ in module $10_1$ and module $10_2$ run in the opposite directions so that the leading transmission lines $18_1$, $18_2$ barely couple between the modules $10_1$ and $10_2$.

The leading transmission lines $18_1$, $18_2$ barely couple with each other, and therefore, the coupling impedance $Z_{0\text{-}coupled}$ of the leading transmission lines $18_1$, $18_2$ is equal to the characteristic impedance $Z_0$, and accordingly, reflection of signals does not occur when the characteristic impedance of the leading transmission lines $18_1$, $18_2$ is designed so as to be equal to the coupling impedance $Z_{0\text{-}coupled}$ in the coupling portion of the signal lines $12_1$, $12_2$.

Thus, the leading transmission lines $18_1$, $18_2$ run in the opposite directions so that no coupling takes place, and therefore, the impedance can be designed without being affected by the fluctuation in the distance between modules $10_1$ and $10_2$, and thus, the design can be assured. Here, this structure can be applied to a case where a feedback path forms a differential line together with a signal line as described below.

Twelfth Embodiment

Figure 18:
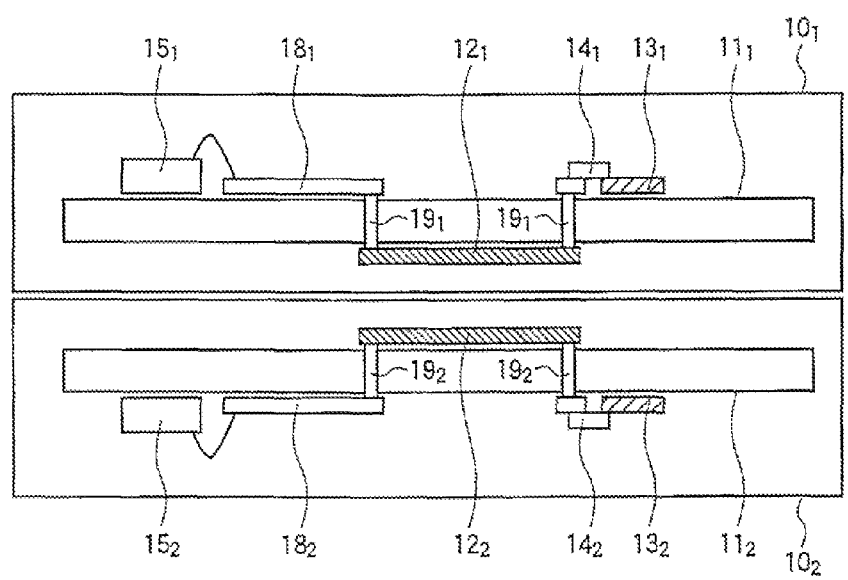
FIG. 18 is a schematic cross-sectional diagram showing the inter-module communication apparatus according to the twelfth embodiment of the present invention.

Next, the inter-module communication apparatus according to the twelfth embodiment of the present invention is described in reference to FIG. 18. FIG. 18 is a schematic cross-sectional diagram showing the inter-module communication apparatus according to the twelfth embodiment of the present invention. As shown in the figure, signal lines $12_1$, $12_2$ are formed on the surface of the substrates $11_1$, $11_2$ on the side opposite to the surface where the leading transmission lines $18_1$, $18_2$ are provided using through vias $19_1$, $19_2$ so that the leading transmission lines $18_1$, $18_2$ barely couple between modules $10_1$ and $10_2$, and modules $10_1$ and $10_2$ are arranged so that the signal lines $12_1$ and $12_2$ face each other, and thus, the distance between the leading transmission lines $18_1$, $18_2$ is increased. Here, feedback paths $13_1$, $13_2$ are also provided on the same surface as the leading transmission lines $18_1$, $18_2$.

In the twelfth embodiment of the present invention, the surfaces of the substrates on which signal lines $12_1$, $12_2$ are provided so as to be a coupler do not have any elements, such as semiconductor integrated circuit apparatuses $15_1$, $15_2$ or resistors $14_1$, $14_2$, and therefore, the signal lines $12_1$ and $12_2$ can be arranged closer to each other so as to make the coupling stronger, and the leading transmission lines $18_1$ and $18_2$ can be arranged further away from each other so as to make the coupling weaker. Here, this structure can be applied to a case where a feedback path forms a differential line together with a signal line as described below.

Thirteenth Embodiment

Figure 19:
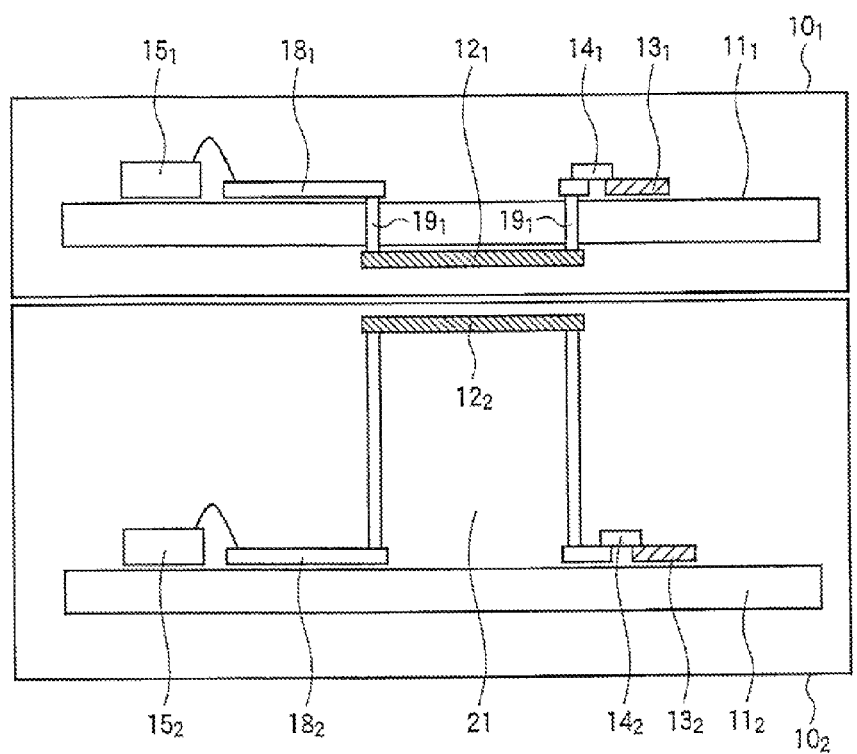
FIG. 19 is a schematic cross-sectional diagram showing the inter-module communication apparatus according to the thirteenth embodiment of the present invention.

Next, the inter-module communication apparatus according to the thirteenth embodiment of the present invention is described in reference to FIG. 19. FIG. 19 is a schematic cross-sectional diagram showing the inter-module communication apparatus according to the thirteenth embodiment of the present invention. As shown in the figure, unlike the eleventh embodiment, the substrates $11_1$ and $11_2$ in the two modules $10_1$ and $10_2$ are arranged in the same direction. At this time, the module $10_2$ on the bottom side is provided with a three-dimensional structure 21 so as to lift up the signal line $12_2$ in order to shorten the distance between the signal lines $12_1$ and $12_2$ and increase the distance between the leading transmission lines $18_1$ and $18_2$.

In the thirteenth embodiment of the present invention, the signal lines $12_1$ and $12_2$ are arranged closer to each other so as to make the coupling stronger, and the leading transmission lines $18_1$ and $18_2$ are arranged further away from each other so as to make the coupling weaker in the state where the substrates $11_1$ and $11_2$ are directed in the same direction. Here, this structure can be applied to a case where a feedback path forms a differential line together with a signal line as described below.

Fourteenth Embodiment

Figure 20A:
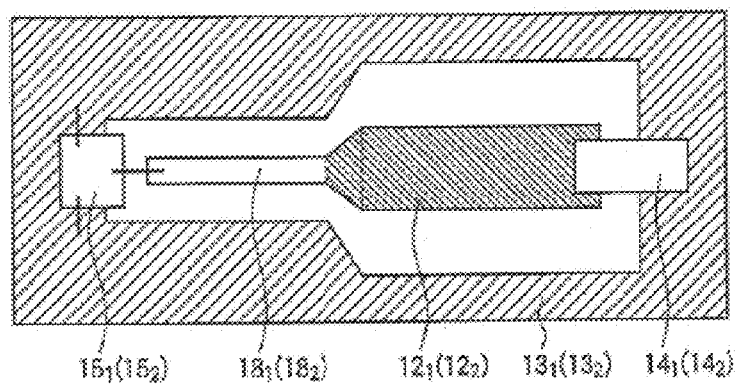
FIGS. 20(a) and 20(b) are diagrams for illustrating the structure of the inter-module communication apparatus according to the fourteenth embodiment of the present invention.
Figure 20B:
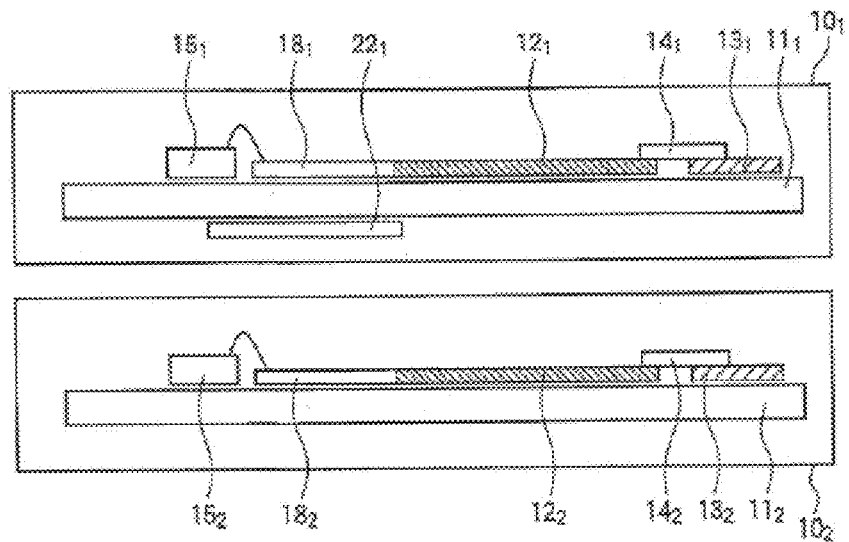

Next, the inter-module communication apparatus according to the fourteenth embodiment of the present invention is described in reference to FIGS. 20(a) and 20(b). FIG. 20(a) is a schematic plan diagram showing a single module, and FIG. 20(b) is a schematic cross-sectional diagram showing the inter-module communication apparatus according to the fourteenth embodiment of the present invention. In the fourteenth embodiment of the present invention, the substrates $11_1$ and $11_2$ are layered on top of each other in the same direction, and a shield layer $22_1$ is provided in such a location as to cover the leading transmission line $18_1$ on the rear surface of the substrate $11_1$ in the module $10_1$ placed on the top side.

Thus, in the fourteenth embodiment of the present invention, the shield layer $22_1$ is provided so that the coupling between the leading transmission lines $18_1$ and $18_2$ can be eliminated.

In the fourteenth embodiment of the present invention, the shield layer $22_1$ is provided so that the impedance can be matched between the semiconductor integrated circuit apparatuses $15_1$, $15_2$, the transmission lines $18_1$, $18_2$ and the signal lines $12_1$, $12_2$ at their terminals without requiring vias or a three-dimensional structure on the substrates $11_1$, $11_2$. Accordingly, no reflection of signals occurs and high speed communication is made possible with high reliability. Here, this structure can be applied to a case where a feedback path forms a differential line together with a signal line as described below.

Fifteenth Embodiment

Figure 21A:
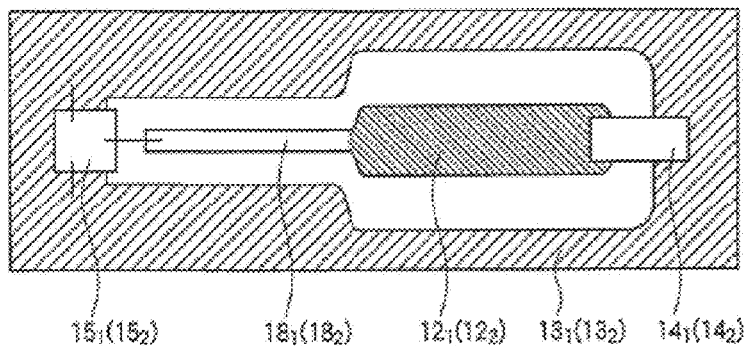
FIGS. 21(a) and 21(b) are diagrams for illustrating the structure of the inter-module communication apparatus according to the fifteenth embodiment of the present invention.
Figure 21B:
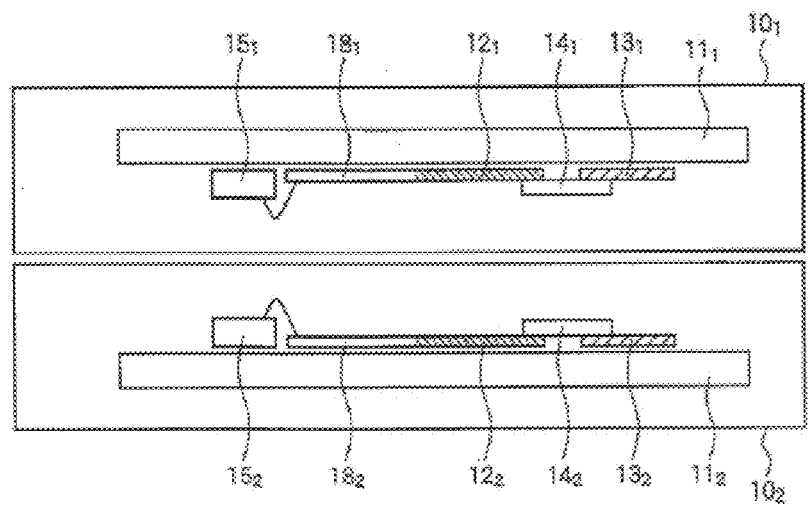

Next, the inter-module communication apparatus according to the fifteenth embodiment of the present invention is described in reference to FIGS. 21(a) and 21(b). FIG. 21(a) is schematic plan diagram showing a single module, and FIG. 21(b) is a schematic cross-sectional diagram showing the inter-module communication apparatus according to the fifteenth embodiment of the present invention. As shown in the figures, the sides of the connection portions between the leading transmission lines $18_1$, $18_2$ and the signal lines $12_1$, $12_2$ are curved.

In the fifteenth embodiment of the present invention, the sides of the connection portions between the leading transmission lines $18_1$, $18_2$ and the signal lines $12_1$, $12_2$ are curved, and therefore, the impedance does not change dramatically so that the impedance is as uniform as possible. As a result of almost uniform impedance, the reflection of signals can be reduced so that a coupler with a broadband can be realized. Here, this structure can be applied to a case where a feedback path forms a differential line together with a signal line as described below.

Sixteenth Embodiment

Figure 22:
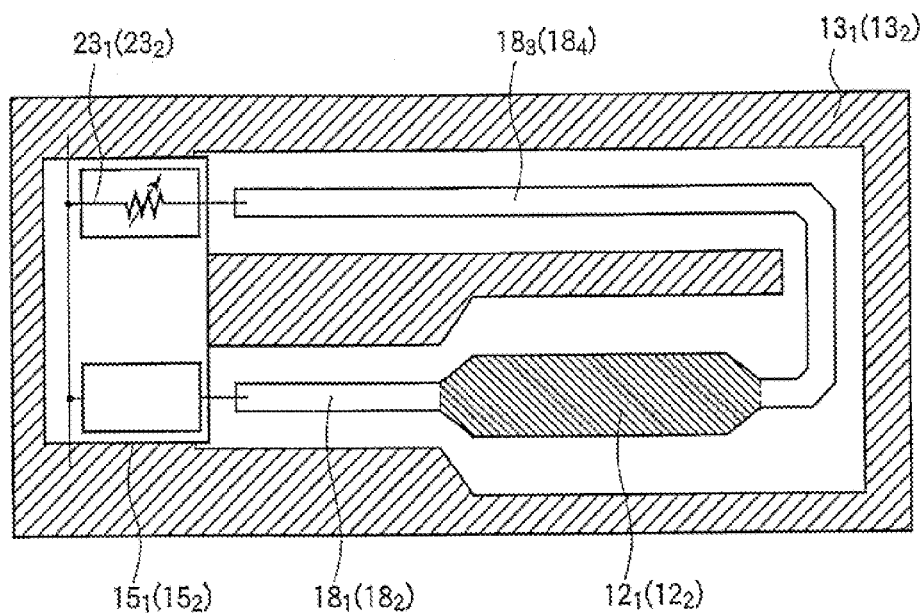
FIG. 22 is a schematic plan diagram showing a single module according to the sixteenth embodiment of the present invention.
Figure 23:
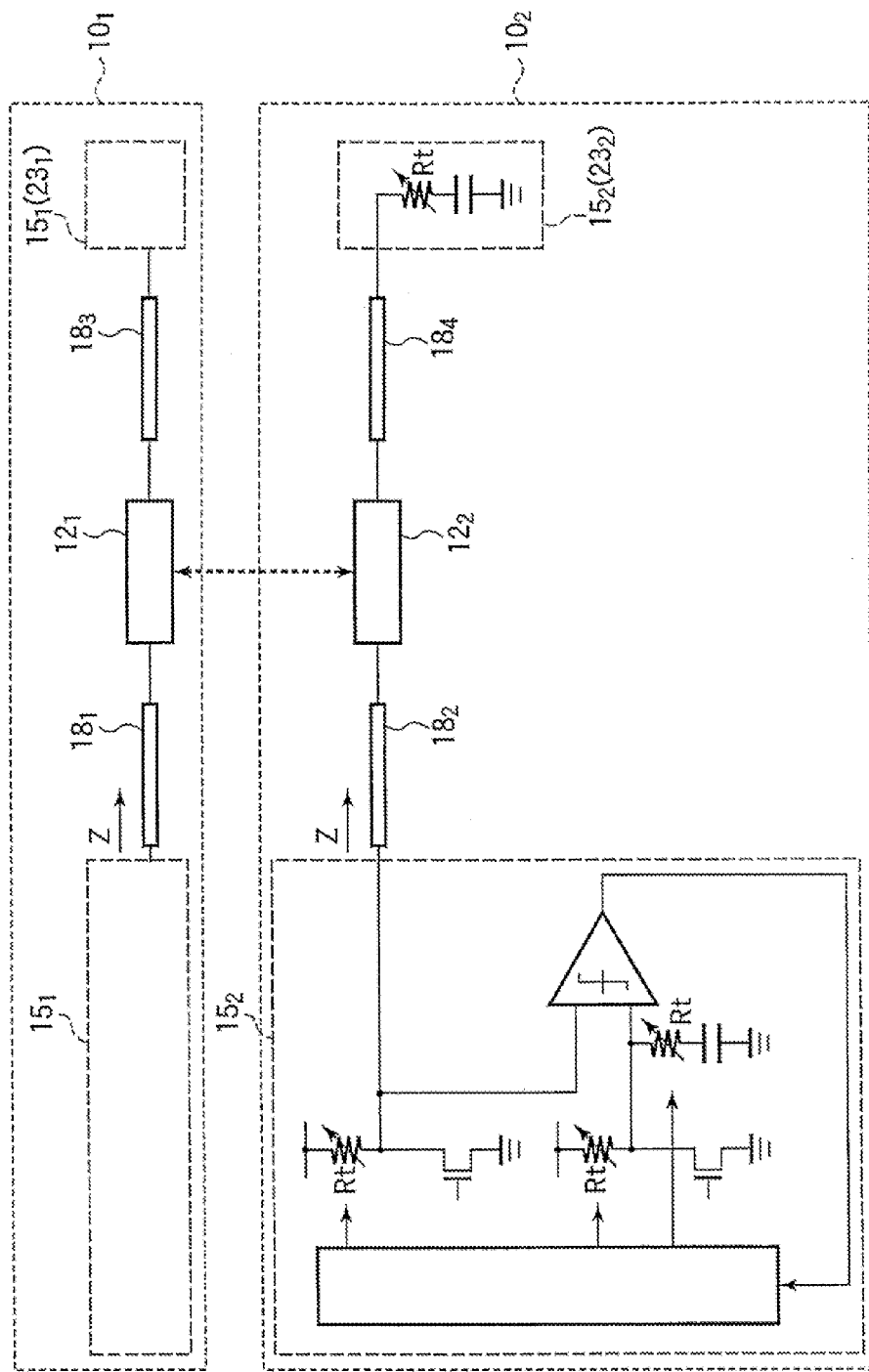
FIG. 23 is a diagram for illustrating an example of a terminal impedance control circuit in the sixteenth embodiment of the present invention.

Next, the inter-module communication apparatus according to the sixteenth embodiment of the present invention is described in reference to FIGS. 22 and 23. FIG. 22 is a schematic plan diagram showing a single module. As shown in the figure, a transmission line $18_3$ ($18_4$) is provided to the other end of the signal line $12_1$ ($12_2$), and a semiconductor integrated circuit apparatus $15_1$ ($15_2$) having a terminal impedance matching circuit $23_1$ ($23_2$) built in is connected to this transmission line $18_3$ ($18_4$). Here, the two may be connected directly through a wire without a transmission line in between in the case where the semiconductor integrated circuit chip can be installed in close proximity to the coupler.

The entirety or part of the function for matching the impedance is provided inside the semiconductor integrated circuit apparatus $15_1$ ($15_2$) so that the impedance can be adjusted. In the case where the coupling impedance $Z_{0-coupled}$ is changed due to the inconsistency during the manufacture of a parameter, such as the line width of the coupled transmission line, or due to the fluctuation of the distance between the lines, mismatching of the impedance occurs, making the coupling coefficient smaller when the value of the matching impedance is fixed. The value of $Z_{0-coupled}$ is detected by monitoring the signal reflection and the like, and thus, the terminating impedance is appropriately adjusted in accordance with the change thereof.

FIG. 23 is a diagram for illustrating an example of the terminal impedance control circuit where a transmitter with a variable output impedance is connected to the signal line $12_2$ in the semiconductor integrated circuit apparatus $15_2$ in module $10_2$. A replica transmitting circuit having the same structure as the above-described transmitter is mounted in the semiconductor integrated circuit apparatus $15_2$ and connected to a replica terminating resistor having the same structure as the variable terminating resistor connected to the other end of the signal line $12_2$. A pattern (for example, 00110011 . . . ) in accordance with the frequency for making the coupling coefficient of the transmission line maximum is outputted from the transmitter, and the output signals from the transmitter and the replica transmitter at this time are monitored.

When the impedance of the coupled transmission lines and the value of the transmitter and the terminal resistor are the same, the output of the transmitter and the output of the replica transmitter have the same value in terms of the signal level. These values are detected by a peak detection circuit, for example, and compared by a comparator, and thus, the value of $R_t$ is changed so that the two become the same. At this time, the terminal of the other end of the transmission line is set to the same value. This is before the impedance is matched, and therefore, the value of the variable terminating resistor at the other end is set using a low speed communication mode.

The value of $R_t$ when the two become the same is maintained in a register or the like so that this set value is used afterwards. In the case where the resistor is controlled by operating the monitor circuit during communication, the optimal terminating resistance value can be maintained even when the impedance of the transmission line changes due to the fluctuation of the communication distance.

Thus, in the sixteenth embodiment of the present invention, the terminal impedance adjusting circuits $23_1$, $23_2$ are provided so that the impedance can be matched even in the case where the impedance of the coupling lines changes due to the inconsistency in the manufacture or the fluctuation in the distance between lines, and therefore, signals can be prevented from being reflected, making high speed communication possible. Here, the two may be connected directly through a wire without having transmission lines $18_1$, $18_2$ in between in the case where the semiconductor integrated circuit apparatuses $15_1$, $15_2$ can be installed in close proximity to the signal lines $12_1$, $12_2$. This structure can be applied to a case where a feedback path forms a differential line together with a signal line as described below.

Seventeenth Embodiment

Figure 24:
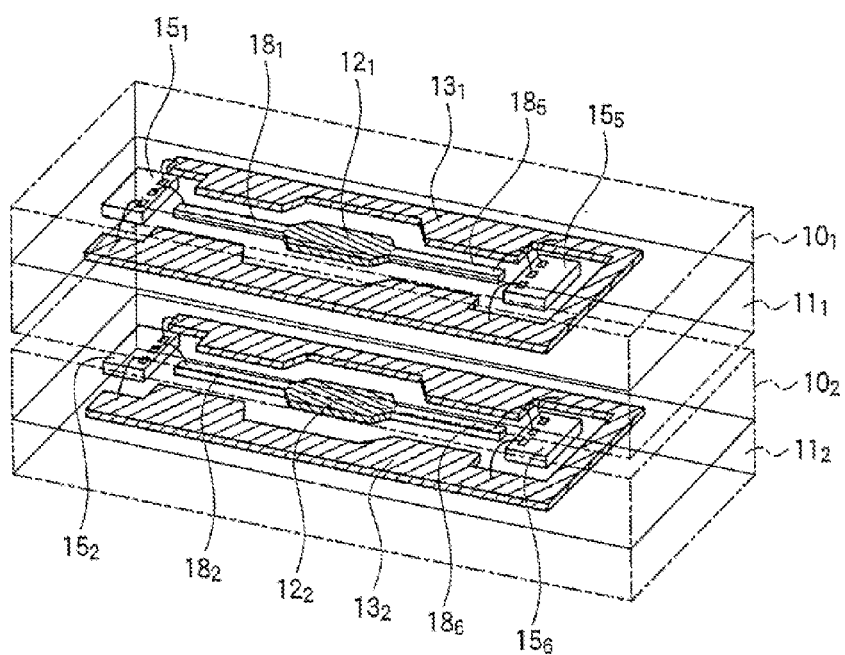
FIG. 24 is a schematic perspective diagram showing the inter-module communication apparatus according to the seventeenth embodiment of the present invention.

Next, the inter-module communication apparatus according to the seventeenth embodiment of the present invention is described in reference to FIG. 24. FIG. 24 is a schematic perspective diagram showing the inter-module communication apparatus according to the seventeenth embodiment of the present invention. As shown in the figure, transmission lines $18_5$, $18_6$ are provided to the other ends of signal lines $12_1$, $12_2$ so as to be connected to semiconductor integrated circuit apparatuses $15_5$, $15_6$ in such a manner that the impedance is matched at each connection point as the coupling impedance.

In the case where the current that flows from terminal 4 to terminal 3 in the other coupler (current in the opposite direction) is sufficiently large as compared to the current that flows from terminal 3 to terminal 4 (current in the forward direction) when a current flows from terminal 1 to terminal 2 in one coupler, for example, in the case where the current that flows from terminal 4 to terminal 3 is 100 times greater than the current that flows from terminal 3 to terminal 4, the signal that has been inputted through terminal 1 can be outputted from terminal 3, and at the same time, the signal that has been inputted through terminal 2 can be outputted from terminal 4, and therefore, one coupler can form two independent communication lines. The signal that has been inputted through terminal 1 can be outputted from terminal 3, and at the same time, the signal that has been inputted through terminal 4 can be outputted from terminal 2.

$S_{31}/s_{41}$ is referred to as separation factor, and when the separation factor $S_{31}/s_{41}$ cannot be made sufficiently large, there are two main possible reasons. One reason is the reflection of signals. When the impedance is matched more completely, the separation factor $S_{31}/s_{41}$ can be increased. The second reason is the difference in the delay in signal propagation between an even-numbered mode and an odd-numbered mode.

When materials having different relative dielectric constants are used as in a microstrip line, for example, the locations through which electric lines of force pass are different between an even-numbered mode and an odd-numbered mode so that there is a difference in the delay in signal propagation, which causes noise at the far end of the coupler. Thus, the separation factor can be increased by making the dielectric constants of the materials as close as possible.

According to the seventeenth embodiment of the present invention, two channels that make simultaneous communication possible with one coupler can be installed, and therefore, the speed of data communication can be made two times faster.

Eighteenth Embodiment

Figure 25A:
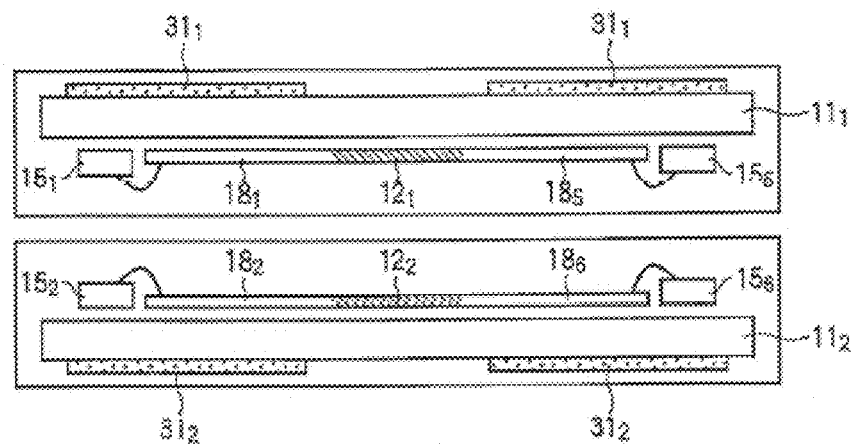
FIGS. 25(a) to 25(d) are diagrams for illustrating the structure of the inter-module communication apparatus according to the eighteenth embodiment of the present invention.
Figure 25B:
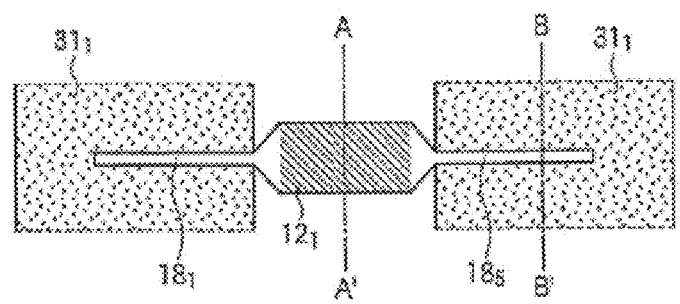
Figure 25C:
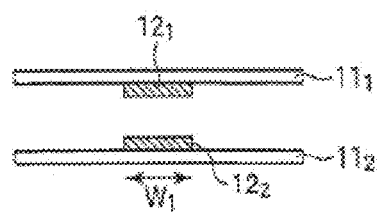
Figure 25D:
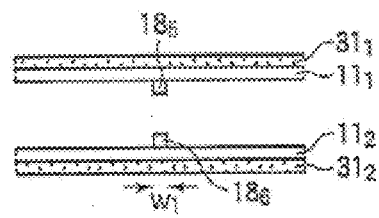

Next, the inter-module communication apparatus according to the eighteenth embodiment of the present invention is described in reference to FIGS. 25(a) to 25(d). FIG. 25(a) is a schematic cross-sectional diagram showing the inter-module communication apparatus according to the eighteenth embodiment of the present invention, FIG. 25(b) is a schematic plan diagram, FIG. 25(c) is a cross-sectional diagram along single-dotted chain line A-A' in FIG. 25(b), and FIG. 25(d) is a cross-sectional diagram along single-dotted chain line B-B' in FIG. 25(b).

In the eighteenth embodiment, a microstrip structure is adopted instead of a coplanar structure as in the seventeenth embodiment, and plates $31_1$, $31_2$ are provided on the rear surfaces of the substrates $11_1$, $11_2$.

In this case as well, the plates $31_1$, $31_2$ do not overlap the portions along the signal lines $12_1$, $12_2$ that form a coupler so that the electric lines of force can be concentrated between the wires in the coupler, and thus, the coupling strength of the coupler can be increased. Here, these plates $31_1$, $31_2$ are generally grounded plates, but it is not necessary for them to be grounded.

In addition, as shown in FIGS. 24(c) and 25(d), the width $W_1$ of the signal lines $12_1$, $12_2$ is narrower than the width $w_1$ of the transmission lines $18_1$, $18_2$, $18_5$ and $18_6$, and therefore, the coupling strength of the coupler can be increased as described in detail in the twenty-third embodiment below.

Nineteenth Embodiment

Figure 26:
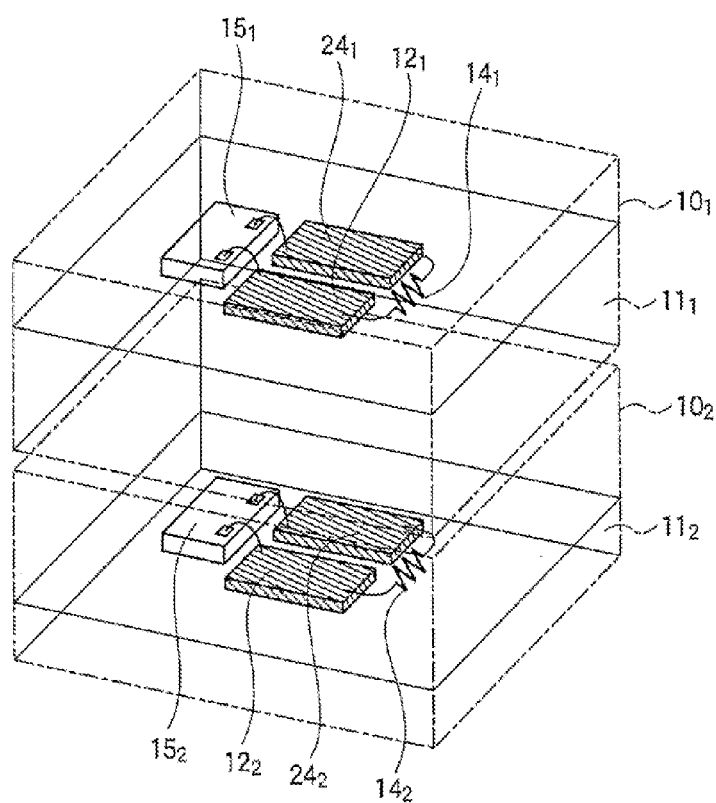
FIG. 26 is a schematic perspective diagram showing the inter-module communication apparatus according to the nineteenth embodiment of the present invention.

Next, the inter-module communication apparatus according to the nineteenth embodiment of the present invention is described in reference to FIGS. 26 to 32. FIG. 26 is a schematic perspective diagram showing the inter-module communication apparatus according to the nineteenth embodiment of the present invention. As shown in the figure, feedback paths $24_1$, $24_2$ have the same structure as the signal lines $12_1$, $12_2$ so as to provide a differential coupler. In this case as well, the feedback paths $24_1$, $24_2$ and the signal lines $12_1$, $12_2$ are terminated with resistors $14_1$, $14_2$ having the characteristic impedance $Z_0$ that is equal to the coupling impedance $Z_{0\text{-}coupled}$.

In the case where the characteristic impedance of one line is 50 Ω, for example, the differential impedance $Z_{diff}$ becomes approximately 100 Ω. To be precise, the differential impedance $Z_{diff}$ becomes 100 Ω in the case where the two lines, that is to say, the feedback path $24_1$ or $24_2$ and the signal line $12_1$ or $12_2$, are away from each other, typically at a distance three or more times greater than the line width, which makes coupling impossible, but the differential impedance $Z_{diff}$ is slightly smaller than 100 Ω, typically by approximately 10%, in the case where the two lines are close to each other to provide proximity effects.

The following table shows the results of simulation of the electromagnetic analysis in order to find the coupling impedance $Z_{0\text{-}coupled}$, the coupling coefficient C and the bandwidth (3-dB BW) of the couplers where the width W of and the space S between two lines having a length of 5 mm are varied.

TABLE 1

| ID | W (mm) | S (mm) | Z0-coupled (Ω) | C (dB) | 3-dB BW (GHz) |
|---|---|---|---|---|---|
| 1 | 0.5 | 0.5 | 80 | 18 | 8 |
| 2 | 0.5 | 1.0 | 94 | 16 | 12 |
| 3 | 0.5 | 1.5 | 102 | 14 | 12 |
| 4 | 0.5 | 2.0 | 107 | 13 | 13 |
| 5 | 0.5 | 2.5 | 110 | 13 | 13 |
| 6 | 0.5 | 3.0 | 112 | 12 | 13 |
| 7 | 1.0 | 0.5 | 63 | 13 | 10 |
| 8 | 1.0 | 1.0 | 73 | 11 | 11 |
| 9 | 1.0 | 1.5 | 79 | 10 | 11 |
| 10 | 1.0 | 2.0 | 82 | 10 | 11 |
| 11 | 1.0 | 2.5 | 84 | 9 | 11 |
| 12 | 1.0 | 3.0 | 85 | 9 | 12 |
| 13 | 1.5 | 0.5 | 54 | 10 | 10 |
| 14 | 1.5 | 1.0 | 62 | 9 | 9 |
| 15 | 1.5 | 1.5 | 66 | 8 | 9 |
| 16 | 1.5 | 2.0 | 68 | 7 | 10 |
| 17 | 1.5 | 2.5 | 70 | 7 | 10 |
| 18 | 1.5 | 3.0 | 71 | 7 | 10 |
| 19 | 2.0 | 0.5 | 48 | 9 | 9 |
| 20 | 2.0 | 1.0 | 54 | 7 | 9 |
| 21 | 2.0 | 1.5 | 58 | 7 | 9 |
| 22 | 2.0 | 2.0 | 60 | 6 | 9 |
| 23 | 2.0 | 2.5 | 61 | 6 | 9 |
| 24 | 2.0 | 3.0 | 62 | 6 | 9 |
| 25 | 2.5 | 0.5 | 44 | 8 | 9 |

TABLE 1-continued

| ID | W (mm) | S (mm) | Z0-coupled (Ω) | C (dB) | 3-dB BW (GHz) |
|---|---|---|---|---|---|
| 26 | 2.5 | 1.0 | 49 | 7 | 9 |
| 27 | 2.5 | 1.5 | 52 | 6 | 8 |
| 28 | 2.5 | 2.0 | 54 | 6 | 9 |
| 29 | 2.5 | 2.5 | 55 | 5 | 9 |
| 30 | 2.5 | 3.0 | 55 | 5 | 9 |
| 31 | 3.0 | 0.5 | 40 | 8 | 9 |
| 32 | 3.0 | 1.0 | 45 | 6 | 9 |
| 33 | 3.0 | 1.5 | 48 | 6 | 9 |
| 34 | 3.0 | 2.0 | 49 | 5 | 9 |
| 35 | 3.0 | 2.5 | 50 | 5 | 9 |
| 36 | 3.0 | 3.0 | 50 | 5 | 9 |

The coupling coefficient C is high and the bandwidth (3-dB BW) is wide when the width is 0.5 mm and the space ranges from 1.5 mm to 2.5 mm. Here, the impedance is approximately 100 Ω and the differential impedance is approximately 200 Ω. Thus, the dimensions of the transmission line coupler are determined by the design target values of the impedance, the coupling coefficient, the bandwidth and the like, and the property values of the materials, such as of the substrates.

Here, the terminating resistor is a part having a size of approximately 1.6 mm×0.8 mm, for example, and therefore, the terminal of the transmission coupler is gradually bent so that the space becomes approximately 1.6 mm for easy connection to the terminating resistor when the space in the transmission coupler ranges from 1.5 mm to 2.5 mm. Here, it is not desirable for the terminal of the transmission coupler to be bent sharply because the impedance is not uniform.

Figure 27A:
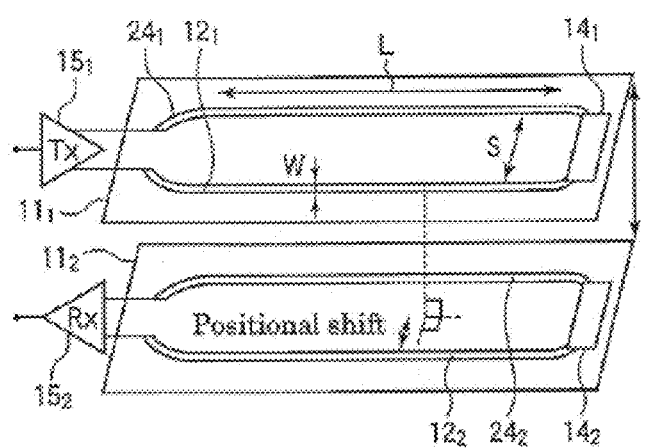
FIGS. 27(a) and 27(b) are a diagram and a graph for illustrating the properties of the inter-module communication apparatus according to the nineteenth embodiment of the present invention.

FIGS. 27(a) to 28(b) are a diagram and graphs for illustrating the properties of the inter-module communication apparatus according to the nineteenth embodiment of the present invention. FIG. 27(a) is a diagram showing an equivalent circuit of the inter-module communication apparatus according to the nineteenth embodiment of the present invention where the width W of the feedback paths $24_1$, $24_2$ and the signal lines $12_1$, $12_2$ is 0.5 mm, the space S between the two is 1.5 mm, and the distance d between the pairs is 1 mm in the coupler.

Figure 27B:
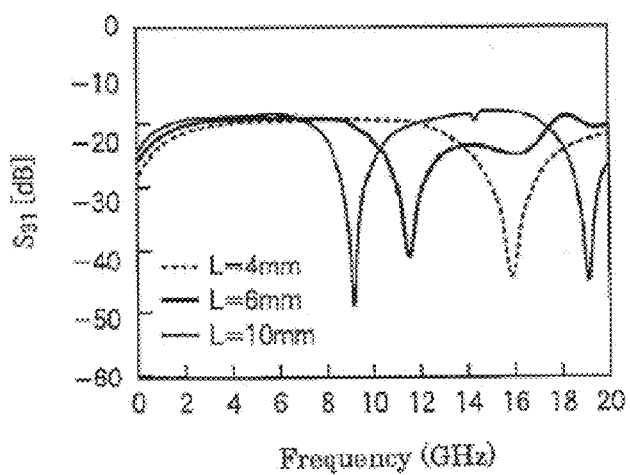

FIG. 27(b) is a graph for illustrating the dependency of the frequency characteristic of the coupling coefficient $S_{31}$ on the length of the coupler. Here, the results of measurement of the coupling coefficient $S_{31}$ when the length L of the coupler is 4 mm, 6 mm and 10 mm, respectively, are shown. As shown in the figure, when L is short, the center frequency is high in reverse proportion to L and the bandwidth is large in proportion to the center frequency.

Figure 28A:
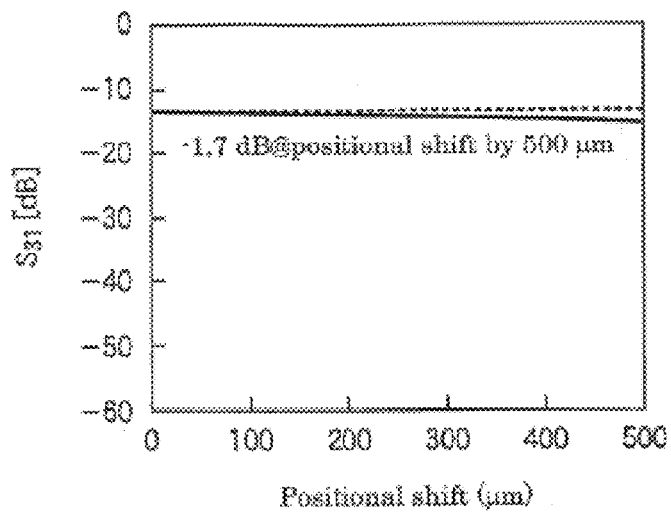
FIGS. 28(a) and 28(b) are graphs for illustrating the other properties of the inter-module communication apparatus according to the nineteenth embodiment of the present invention.

FIG. 28(a) is a graph for illustrating the dependency of the frequency characteristics of the coupling coefficient $S_{31}$ on the positional shift of the coupler. As shown in the figure, the coupling coefficient barely changes even in the case where there is a shift in the direction indicated in FIG. 27(a). It can be seen from this that communication between modules is possible even when the positions of the modules relative to each other change.

Figure 28B:
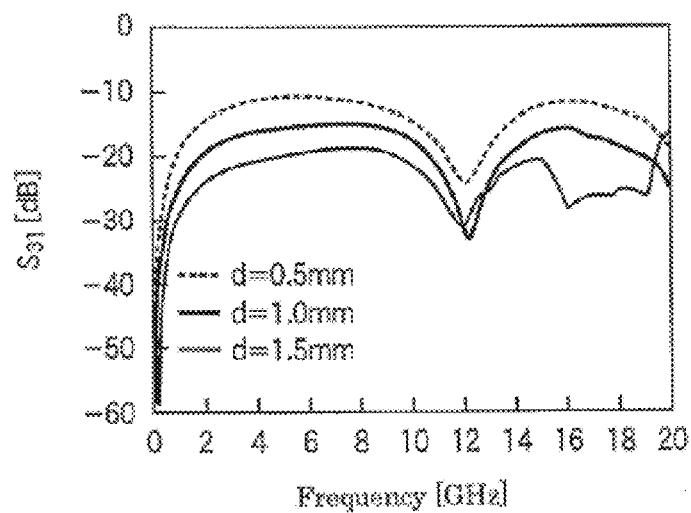

FIG. 28(b) is a graph for illustrating the dependency of the frequency characteristics of the coupling coefficient $S_{31}$ on the distance d in the coupler and shows the results of measurement of the coupling coefficient $S_{31}$ for the distance d of 0.5 mm, 1 mm and 1.5 mm, respectively, when the width W of the coupler is 0.5 mm, the space S is 1.5 mm, and the length L is 6 mm. As shown in the figure, when the module distance d is greater, making the communication distance longer, the coupling coefficient $S_{31}$ is lower, but the bandwidth barely changes. Accordingly, communication is possible at the same speed even when the distance varies in the case where the gain of the amplifier in the input stage of the receiver is adjusted in accordance with the communication distance.

Figure 29:
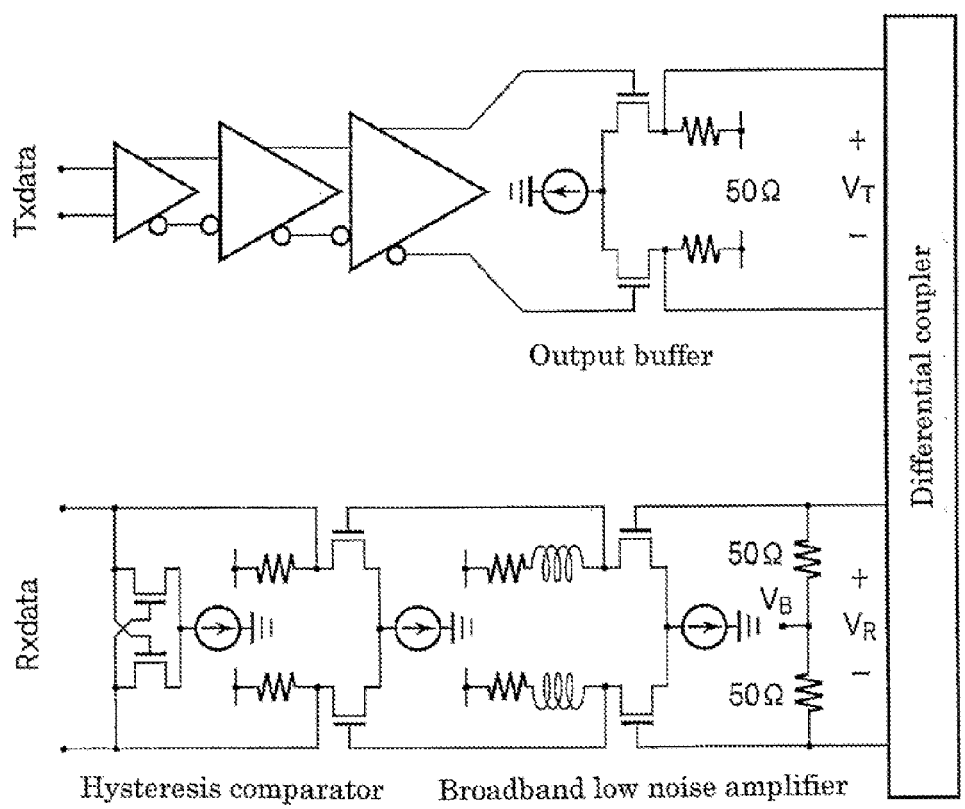
FIG. 29 is a diagram for illustrating the structure of the transmitting and receiving circuit for forming the inter-module communication apparatus according to the nineteenth embodiment of the present invention.
Figure 30:
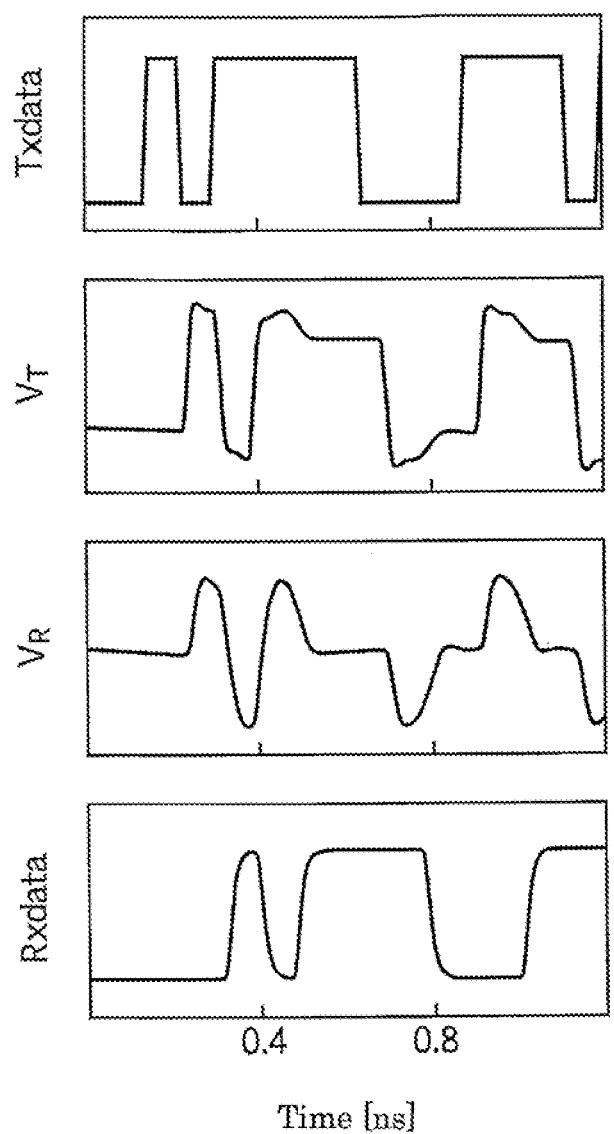
FIG. 30 is a graph for illustrating an example of the operational waveforms in the transmitting and receiving circuit for forming the inter-module communication apparatus according to the nineteenth embodiment of the present invention.

FIG. 29 is a diagram for illustrating the structure of the transmitting and receiving circuit for forming the inter-module communication apparatus according to the nineteenth embodiment of the present invention, and FIG. 30 is a graph for illustrating an example of the operation waveforms. When the output voltage value of the output buffer is varied in accordance with the transmitted digital data in the module on the transmission side, the current that flows through the differential coupler changes, and a signal gained by differentiating the signal waveform on the transmission side is generated on the reception module side in the direction opposite to the direction of the current on the transmission module side. The reason why a differential signal is generated is because the coupler has the same frequency characteristics as in the magnetic field coupling in the lower range.

The receiver restores the original signal through a hysteresis comparator after amplifying the received signal in a broadband low noise amplifier. Many other methods for transmission and reception are possible when the signal is differentiated in the communication line. For example, the signal may be integrated using an integrating circuit in the receiver. Alternatively, the transmitter and the receiver may be combined for integration. The integrating operation may be carried out in an analog circuit or through digital signal processing.

Figure 31:
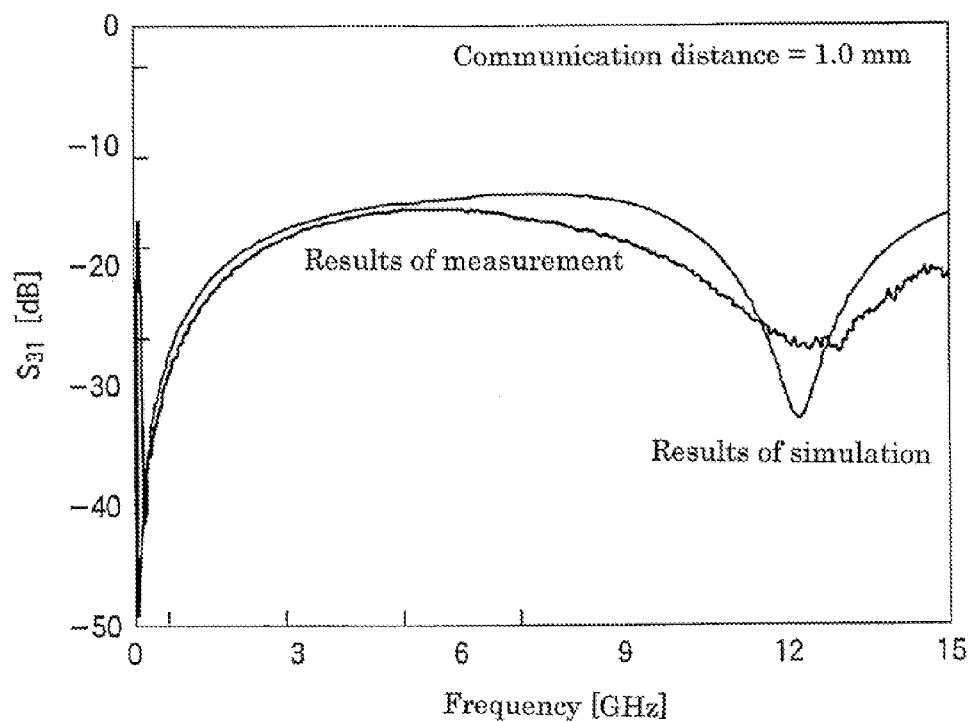
FIG. 31 is a graph for illustrating the results of the measurement of the frequency characteristics in the nineteenth embodiment of the present invention.

FIG. 31 is a graph for illustrating the results of measurement of the frequency characteristics in the nineteenth embodiment of the present invention where the frequency characteristics that are almost the same as the simulation results are gained.

Figure 32:
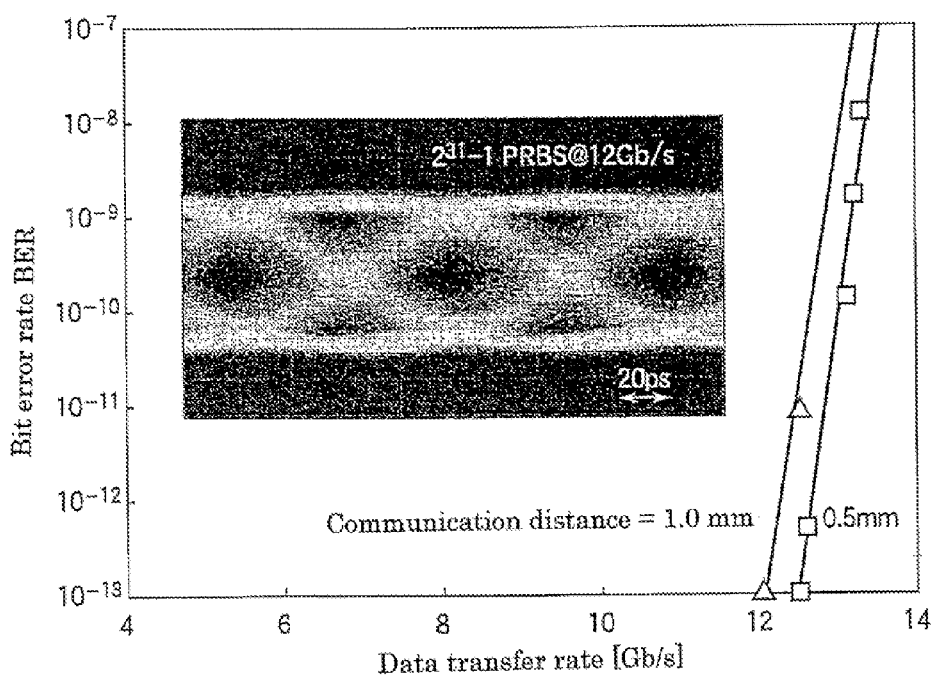
FIG. 32 is a graph for illustrating the measured data showing the relationship between the bit error rate (BER) and the data transfer rate when data communication is carried out using pseudo-random data.

FIG. 32 is a graph for illustrating the measured data of the relationship between the bit error rate (BER) and the data transfer rate when data communication is carried out using pseudo-random data, and it can be seen that high speed data communication is possible with high reliability in the structure according to the nineteenth embodiment.

Thus, in the differential structure according to the nineteenth embodiment of the present invention, resistance to in-phase noise is high as compared to the case with a single end. In addition, the coupling impedance $Z_{0\text{-}coupled}$ is easy to control and can be handled without a feedback path, which makes designing easy. Though one of the differential lines is a signal path and the other is a feedback path in the nineteenth embodiment, a feedback path may be provided in addition to the differential line.

Twentieth Embodiment

Figure 33:
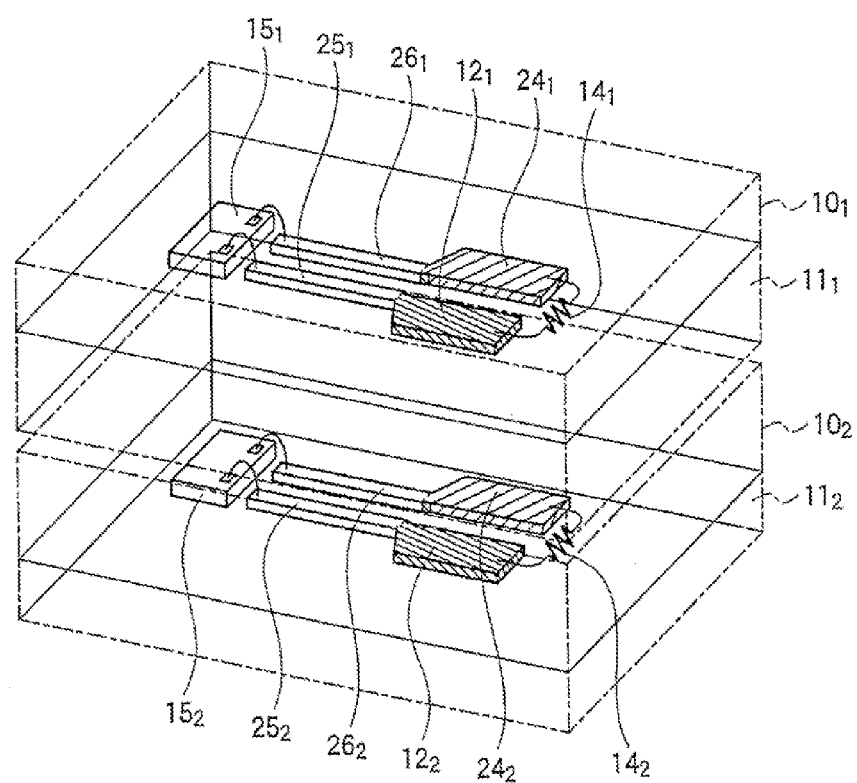
FIG. 33 is a schematic perspective diagram showing the inter-module communication apparatus according to the twentieth embodiment of the present invention.

Next, the inter-module communication apparatus according to the twentieth embodiment of the present invention is described in reference to FIG. 33. FIG. 33 is a schematic perspective diagram showing the inter-module communication apparatus according to the twentieth embodiment of the present invention. In the eighteenth embodiment, all of the signal lines $12_1$, $12_2$ and the feedback paths $24_1$, $24_2$ are provided with a leading transmission line $25_1$, $25_2$, $26_1$ or $26_2$.

In this case as well, the semiconductor circuit apparatuses $15_1$, $15_2$, the transmission lines $25_1$, $25_2$, $26_1$, $26_2$, the signal lines $12_1$, $12_2$ and the feedback paths $24_1$, $24_2$ are connected with the impedance being matched, and the impedance is also matched at the terminals of the signal lines $12_1$, $12_2$ and the feedback paths $24_1$, $24_2$.

It is desirable for the transmission lines $25_1$, $25_2$, $26_1$, $26_2$ in modules $10_1$, $10_2$ not to couple with each other, and therefore, for example, the transmission lines $25_1$, $25_2$, $26_1$, $26_2$ have a line width narrower than that of the signal lines $12_1$, $12_2$ and the feedback paths $24_1$, $24_2$, or it is desirable for the respective transmission lines to be away from each other in the layout in such a manner that they are not located in the same locations when they are projected in the direction in which they are layered on top of each other.

In this figure, the differential transmission lines are closely coupled to each other, and concretely, the transmission lines $25_1$, $25_2$, $26_1$, $26_2$ are arranged so that the distance between them is within the length that is three times greater than the width of the transmission lines, and thus, they are coupled. In this case, in addition to the differential lines, feedback paths may be provided next to and parallel to the transmission lines $25_1$, $25_2$, $26_1$, $26_2$ or may be provided on the surface of the FCB on the opposite side.

In the twentieth embodiment of the present invention, the leading transmission lines $25_1$, $25_2$, $26_1$, $26_2$ are provided, and therefore, there are effects due to the differential characteristics, and in addition, the semiconductor integrated circuit apparatuses $15_1$, $15_2$ having a transmitter and a receiver can be installed in locations away from the signal lines $12_1$, $12_2$ and the feedback paths $24_1$, $24_2$, and therefore, the freedom in designing increases.

Twenty-First Embodiment

Figure 34A:
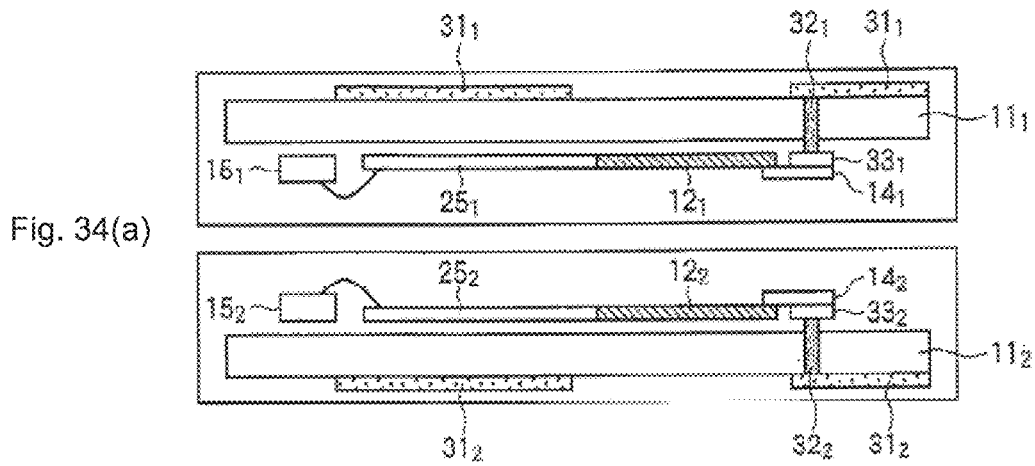
FIGS. 34($a$) to 34($d$) are diagrams for illustrating the structure of the inter-module communication apparatus according to the twenty-first embodiment of the present invention.
Figure 34B:
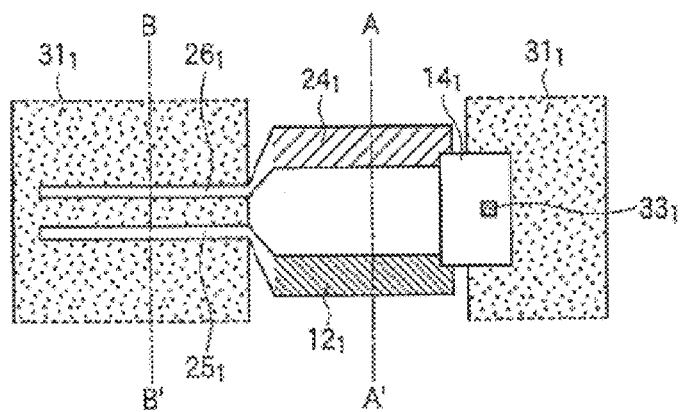
Figure 34C:
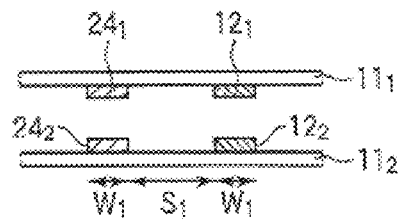
Figure 34D:
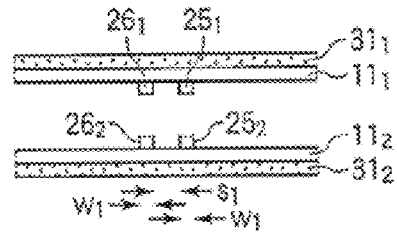

Next, the inter-module communication apparatus according to the twenty-first embodiment of the present invention is described in reference to FIGS. 34(a) to 34(d). FIG. 34(a) is a schematic cross-sectional diagram showing the inter-module communication apparatus according to the twenty-first embodiment of the present invention, FIG. 34(b) is a schematic plan diagram, FIG. 34(c) is a cross-sectional diagram along single-dotted chain line A-A' in FIG. 34(b), and FIG. 34(d) is a cross-sectional diagram along single-dotted chain line B-B' in FIG. 34(b).

In the twenty-first embodiment, a microstrip structure and the other structures in the twentieth embodiment are adopted, and plates $31_1$, $31_2$ are provided on the rear surfaces of the substrates $11_1$, $11_2$ and connected to resistors $14_1$, $14_2$ through vias $32_1$, $32_2$ and lands $33_1$, $33_2$.

In this case, the plates $31_1$, $31_2$ do not overlap the portions of the signal lines $12_1$, $12_2$ and the feedback paths $24_1$, $24_2$ that form a coupler so that electric lines of force can be concentrated between the wires in the coupler, and thus, the coupling strength of the coupler can be increased. Here, the plates $31_1$, $31_2$ are generally grounded plates, but it is not necessary for them to be grounded.

In addition, as shown in FIGS. 34(c) and 34(d), the width $W_1$ of the signal lines $12_1$, $12_2$ and the feedback paths $24_1$, $24_2$ are narrower than the width $w_1$ of the transmission lines $25_1$, $25_2$, $26_1$, $26_2$, and therefore, as described in detail in the twenty-third embodiment below, the coupling strength of the coupler can be increased. Furthermore, the space $S_1$ between the signal lines $12_1$, $12_2$ and the feedback paths $24_1$, $24_2$ is wider than the space $s_1$ between the transmission lines $25_1$, $25_2$ and the transmission lines $26_1$, $26_2$, and therefore, the coupling strength of the coupler can be increased in this regard.

Twenty-Second Embodiment

Figure 35:
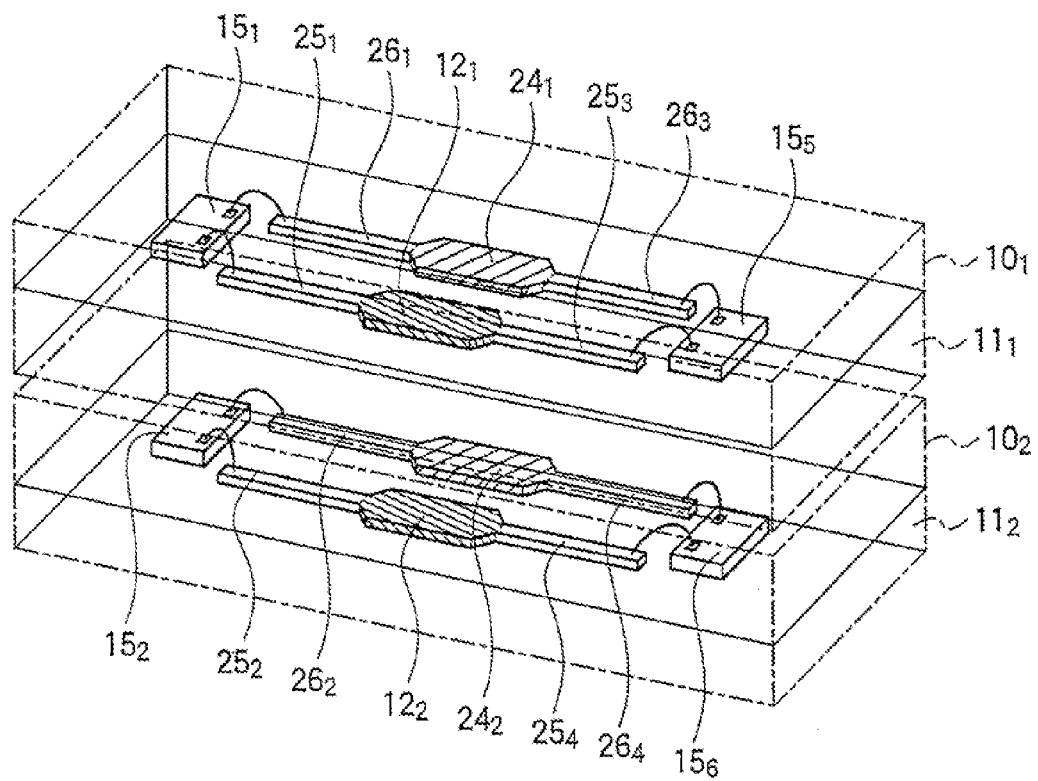
FIG. 35 is a schematic perspective diagram showing the inter-module communication apparatus according to the twenty-second embodiment of the present invention.

Next, the inter-module communication apparatus according to the twenty-second embodiment of the present invention is described in reference to FIG. 35. FIG. 35 is a schematic perspective diagram showing the inter-module communication apparatus according to the twenty-second embodiment of the present invention. In the twenty-second embodiment, leading transmission lines $25_3$, $25_4$, $26_3$, $26_4$ are provided at the other ends of the signal lines $12_1$, $12_2$ and the feedback paths $24_1$, $24_2$, and semiconductor integrated circuit apparatuses $15_5$, $15_6$ are connected to these leading transmission lines $25_3$, $25_4$, $26_3$, $26_4$.

In the twenty-second embodiment of the present invention, there are effects due to the differential characteristics, and in addition, two channels that make simultaneous communication possible with one coupler can be installed so that the speed of data communication can be made twice as fast.

Twenty-Third Embodiment

Figure 36A:
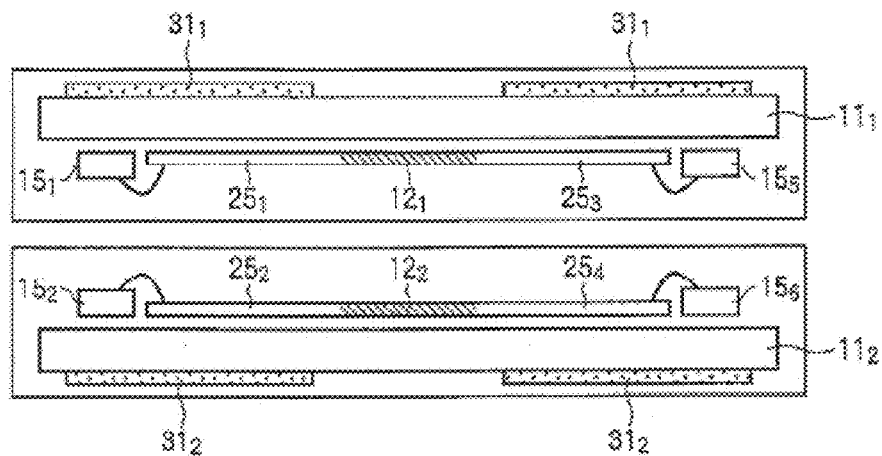
FIGS. 36($a$) to 36($d$) are diagrams for illustrating the structure of the inter-module communication apparatus according to the twenty-third embodiment of the present invention.
Figure 36B:
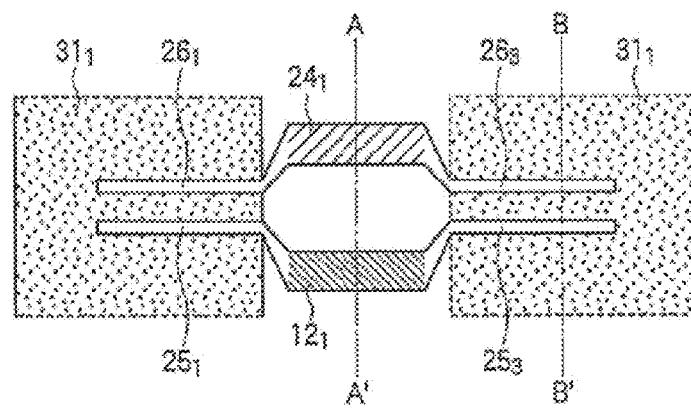
Figure 36C:
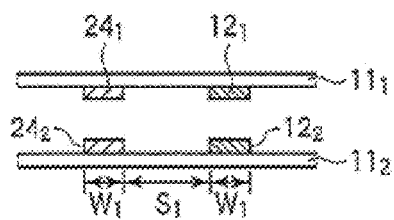
Figure 36D:
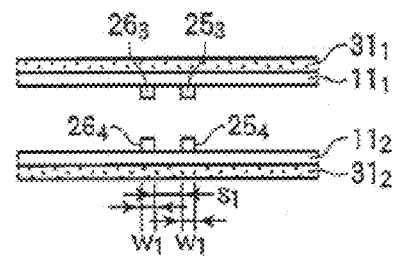

Next, the inter-module communication apparatus according to the twenty-third embodiment of the present invention is described in reference to FIGS. 36(a) to 38(c). FIG. 36(a) is a schematic cross-sectional diagram showing the inter-module communication apparatus according to the twenty-third embodiment of the present invention, FIG. 36(b) is a schematic plan diagram, FIG. 36(c) is a cross-sectional diagram along single-dotted chain line A-A' in FIG. 36(b), and FIG. 36(d) is a cross-sectional diagram along single-dotted chain line B-B' in FIG. 36(b).

In the twenty-third embodiment, a microstrip structure and the other structures in the twenty-second embodiment are adopted, and the plates $31_1$, $31_2$ are provided on the rear surfaces of the substrates $11_1$, $11_2$, and at the same time, the space $S_1$ between the signal lines $12_1$, $12_2$ and the feedback paths $24_1$, $24_2$ is wider than the space $s_1$ between the transmission lines $25_1$, $25_2$, $25_3$, $25_4$ and the transmission lines $26_1$, $26_2$, $26_3$, $26_4$.

In this case, the plates $31_1$, $31_2$ do not overlap the portions of the signal lines $12_1$, $12_2$ and the feedback paths $24_1$, $24_2$ that form a coupler so that electric lines of force can be concentrated between the wires in the coupler, and thus, the coupling strength of the coupler can be increased. Here, the plates $31_1$, $31_2$ are generally grounded plates, but it is not necessary for them to be grounded.

Here, the reasons why plates $31_1$, $31_2$ are provided are described in detail. There are cases where the leading transmission lines $25_1$, $25_2$, $25_3$, $25_4$, $26_1$, $26_2$, $26_3$, $26_4$ that are connected to the differential coupler provide a structure where the distance between the signal lines $12_1$, $12_2$ and the feedback paths $24_1$, $24_2$ is three times greater or more than the width thereof so that the lines are weakly coupled, and a structure where the distance is within the length that is three times greater than the width so that the lines are tightly coupled. In the case where the lines are weakly coupled, the lines need to be arranged on the plates $31_1$, $31_2$ as shown in the figures in order to regulate the characteristic impedance of the differential mode of the lines.

Meanwhile, in the case where the lines are tightly coupled as well, it is desirable for the lines to be arranged on the plates $31_1$, $31_2$ as shown in the figures in order to increase the resistance to noise and regulate the characteristic impedance of the in-phase mode. Here, the plates $31_1$, $31_2$ do not overlap the portions that form the coupler so that electric lines of force can be concentrated between the wires in the coupler, and thus, the coupling strength of the coupler can be increased.

Next, the relationships between the distances between and the widths of the transmission lines $25_1$, $25_2$, $25_3$, $25_4$, $26_1$, $26_2$, $26_3$, $26_4$, the signal lines $12_1$, $12_2$ and the feedback paths $24_1$, $24_2$ are described. The distance (t) between the plates $31_1$, $31_2$ and the transmission lines $25_1$, $25_2$, $25_3$, $25_4$, $26_1$, $26_2$, $26_3$, $26_4$ is typically approximately 0.02 mm (in the case of a flexible substrate) to approximately 0.1 mm (in the case of an FR4 circuit board). In the case where the differential characteristic impedance is 100 Ω (corresponding to a case where each line is 50 Ω in a single phase), for example, the line width $w_1$ and the distance $s_1$ are typically approximately 0.1 mm to 0.4 mm.

In order to prevent the reflection of signals in the connection portion between the leading transmission lines $25_1$, $25_2$, $25_3$, $25_4$, $26_1$, $26_2$, $26_3$, $26_4$ and the signal lines $12_1$, $12_2$ and the feedback paths $24_1$, $24_2$ that form a coupler, it is necessary for the impedance to be matched between the transmission lines $25_1$, $25_2$, $25_3$, $25_4$, $26_1$, $26_2$, $26_3$, $26_4$ and the coupler. The characteristic impedance $Z_{ver}$ in the coupler portion can be represented by the following formula (7) in the same manner as in the above-described formula (3) using the even-numbered mode impedance ($Z_{even,\ ver}$) and the odd-numbered mode impedance ($Z_{odd,\ ver}$).

[Formula 7]

$$Z_{ver} = \sqrt{Z_{even,ver} \cdot Z_{odd,ver}} \quad (7)$$

In the case where the characteristic impedance of the transmission lines $25_1$, $25_2$, $25_3$, $25_4$, $26_1$, $26_2$, $26_3$, $26_4$ is 100 Ω, for example, $Z_{even,\ ver}$ and $Z_{odd,\ ver}$ are set so that the differential characteristic impedance $Z_{ver}$ in the coupler portion is 100 Ω (50 Ω in a single phase).

Figure 37A:
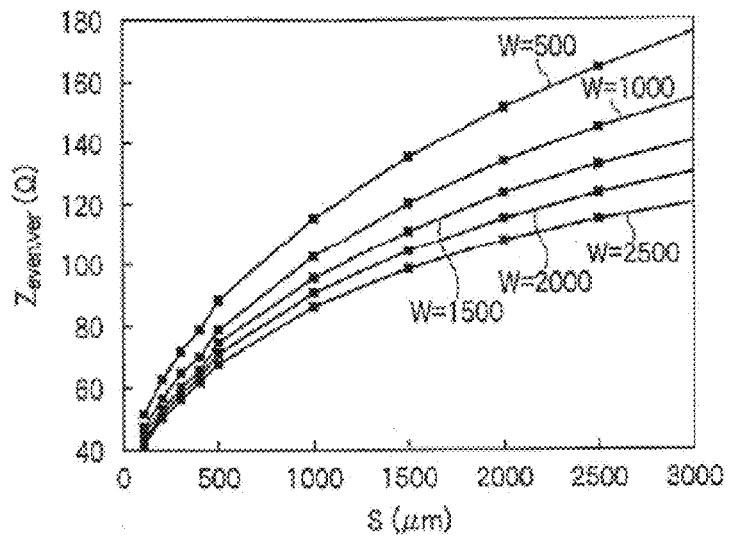
FIGS. 37($a$) and 37($b$) are graphs for illustrating the dependency on the line width and the dependency on the gaps of the impedance.
Figure 37B:
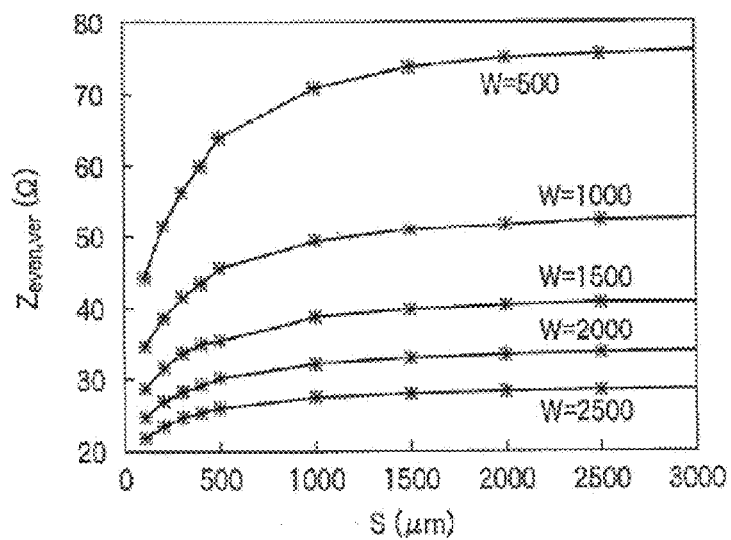

FIG. 37(a) is a graph for illustrating the dependency of the even-numbered mode impedance $Z_{even,\ ver}$ on the line width and the distance, and FIG. 37(b) is a graph for illustrating the dependency of the odd-numbered mode impedance $Z_{odd,\ ver}$ on the line width and the distance. Here, the values in the case where the distance $d_1$ in the coupler is 1 mm are shown as a result of calculation using the electromagnetic field analysis simulator.

As shown in FIGS. 37(a) and 37(b), when the distance $S_1$ between the signal lines $12_1$, $12_2$ and the feedback path $24_1$, $24_2$ is kept constant and the line width $W_1$ is widened, the capacitance between the lines increases and $Z_{even,\ ver}$ and $Z_{odd,\ ver}$ are both reduced. In addition, when the line width $W_1$ is kept constant and the distance $S_1$ is widened, the capacitance is reduced due to an increase in the distance between the lines that face diagonally and the area where the magnetic flux is formed is increased, and therefore, $Z_{even,\ ver}$ and $Z_{odd,\ ver}$ increase.

Meanwhile, the coupling strength in the coupler can be represented by the following formula (8) in the same manner as in the above-described formula (2).

[Formula 8]

$$C = 20\log\left(\frac{Z_{even,ver} - Z_{odd,ver}}{Z_{even,ver} + Z_{odd,ver}}\right) \quad (8)$$

Accordingly, the coupling can be made stronger by making the difference between $Z_{even,\ ver}$ and $Z_{odd,\ ver}$ larger.

When $W_1=0.5$ mm and $s_1=0.2$ mm, for example, it is found from FIGS. 37(a) and 37(b) that $Z_{even,\ ver} \approx 60$ Ω and $Z_{odd,\ ver} \approx 45$ Ω, and thus, $Z_{ver} \approx 50$ Ω. At this time, the coupling strength is approximately −17 dB. Next, when $W_1=2$ mm and $s_1=$ approximately 0.8 mm, $Z_{even,\ ver} \approx 80$ Ω and $Z_{odd,\ ver} \approx 30$ Ω, and thus, $Z_{ver} \approx 50$ Ω. At this time, the coupling strength is approximately −7 dB, and thus, the coupling is stronger than the previous case.

When $W_1$ and $s_1$ are made greater, the coupling strength can further be increased. However, the size of the coupler increases, making the efficiency deteriorate when the apparatus is mounted, and in addition, the frequency band changes due to the arrangement in the direction of the length of the coupler, and as a result of these reasons, there are upper limits in the values of $W_1$ and $s_1$.

In addition, the greater the line width and the distance are, the harder the system is affected by the error in the misalignment of the connection portion, and typically, it is necessary for $W_1 > 0.3$ mm. Because of these reasons, it is designed so that $W_1 \geq w_1$ and the coupling strength can be made great.

In addition, the line width $W_1$ of the coupler can be increased so that the coupling strength is not reduced by much even when there is an error in the positioning, and thus, such effects can be gained that it is easy to mount the system with the allowance for error in the positioning being large in the case where a pair of couplers face each other so as to be coupled.

When the distance $S_1$ between the couplers is small, designing becomes very difficult because the characteristic impedance in the coupler portion is affected by the other three couplers. Meanwhile, the distance $S_1$ between the couplers can be set sufficiently large so that designing becomes easy because the characteristic impedance in the coupler portion is determined only by the effects of the coupler to be coupled. Accordingly, it is desirable for $S_1 \geq s_1$ from the point of view of the easiness in designing.

In addition, the greater the distance $S_1$ between the couplers is as compared to the line width $W_1$, the weaker the differential coupling is, and thus, the easier designing is. In particular, when the distance $S_1$ is two times greater or more than the line width $W_1$, the coupling is sufficiently weak, which is desirable. Meanwhile, when the distance $S_1$ is three times greater or more than the line width $W_1$, the impedance is not affected by the distance $S_1$ no matter how great the distance $S_1$ is.

Accordingly, in the twenty-third embodiment, the line width $W_1$ of and the distance $S_1$ between the signal lines $12_1$, $12_2$ and the feedback paths $24_1$, $24_2$ that form the coupler are greater than the line width $w_1$ of and the distance $s_1$ between the leading transmission lines $25_1$, $25_2$, $26_1$, $26_2$, and therefore, the coupling strength of the coupler can be increased.

Figure 38A:
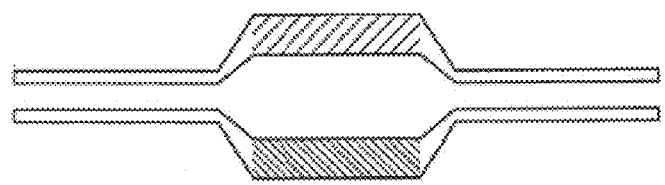
FIGS. 38($a$) to 38($c$) are diagrams for illustrating different patterns of the connection portion between the coupler and the leading transmission lines.
Figure 38B:
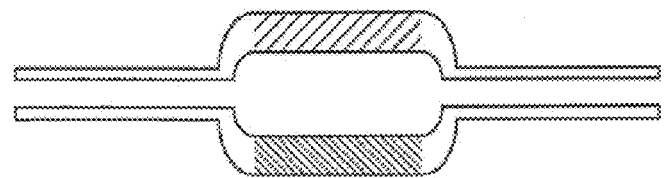
Figure 38C:
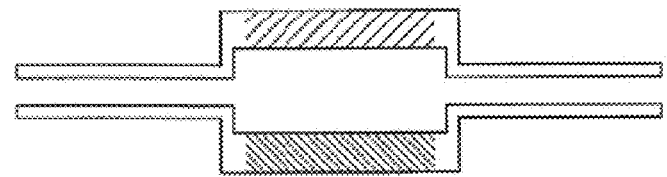
Figure 39:
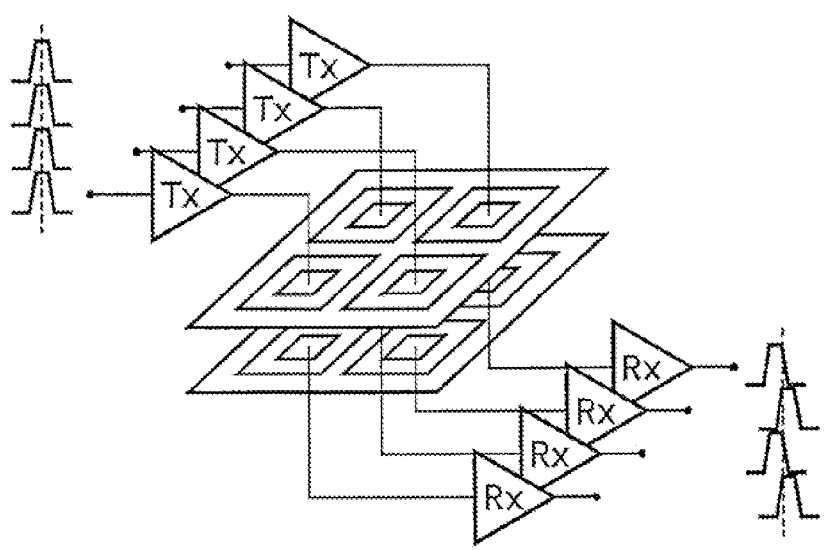
FIG. 39 is a diagram for illustrating the structure of conventional inter-module data communication using coils.

FIGS. 38(a) to 38(c) are diagrams for illustrating patterns of connection portions between the signal lines $12_1$, $12_2$, the feedback paths $24_1$, $24_2$ and the leading transmission lines $25_1$, $25_2$, $25_3$, $25_4$, $26_1$, $26_2$, $26_3$, $26_4$ that form a coupler, and the same effects can be gained in all the cases.

Though the embodiments of the present invention are described above, the present invention is not limited to the structures concretely shown, and the characteristic structures may be combined as long as there are no inconsistencies in the working effects. For example, any of the structures in the second, fourth, fifth, sixth, seventh, eighth, tenth, eleventh, twelfth, thirteenth, fourteenth or fifteenth embodiment may be combined with the differential structure according to the seventeenth to nineteenth embodiments of the invention as described above.

What is claimed is:

1. An inter-module communication apparatus, comprising a first module and a second module that are arranged in close proximity so as to face each other, wherein
the first module at least includes:
a first signal line of which the characteristic impedance has an impedance of $Z_{01}$;
a first feedback signal line for providing a feedback path for the first signal line;
a first terminating member that terminates the first signal line and the first feedback signal line; and
a first semiconductor integrated circuit apparatus with a transmitting and receiving circuit,
the second module at least includes:
a second signal line of which the characteristic impedance has an impedance of $Z_{02}$;
a second feedback signal line for providing a feedback path for the second signal line;

a second terminating member that terminates the second signal line and the second feedback signal line; and a second semiconductor integrated circuit apparatus with a transmitting and receiving circuit, the impedances of the first terminating member and the second terminating member are coupling impedances that reflect the proximity effects in a coupling state of the first module and the second module, which are different from $Z_{01}$ and $Z_{02}$, the first signal line and the second signal line at least partially overlap when projected as viewed in a direction in which the two are layered on top of each other, and the first feedback signal line and the second feedback signal line at least partially overlap when projected as viewed in the direction in which the two are layered on top of each other, signal coupling occurs between the first signal line and the second signal line using capacitive coupling and inductive coupling, and feedback signal coupling occurs between the first feedback signal line and the second feedback signal line using capacitive coupling and inductive coupling, a first insulating substrate and a second insulating substrate are layered on top of each other so that the signal coupling allows a signal from the first signal line to be transmitted through the second signal line, and either a gap between the first signal line and the second signal line or the width of an overlap between the first signal line and the second signal line is different depending on a direction in which signals propagate so that a coupling state between the first signal line and the second signal line is different depending on the direction in which the signals propagate, and wherein frequency characteristics of coupling coefficients for the first signal line and the second signal line are flat.

2. An inter-module communication apparatus, comprising a first module and a second module that are arranged in close proximity so as to face each other, wherein the first module at least includes:
a first signal line of which the characteristic impedance has an impedance of $Z_{01}$;
a first feedback signal line for providing a feedback path for the first signal line;
a first terminating member that terminates the first signal line and the first feedback signal line; and
a first semiconductor integrated circuit apparatus with a transmitting and receiving circuit, the second module at least includes:
a second signal line of which the characteristic impedance has an impedance of $Z_{02}$;
a second feedback signal line for providing a feedback path for the second signal line;
a second terminating member that terminates the second signal line and the second feedback signal line; and
a second semiconductor integrated circuit apparatus with a transmitting and receiving circuit, the impedances of the first terminating member and the second terminating member are coupling impedances that reflect the proximity effects in a coupling state of the first module and the second module, which are different from $Z_{01}$ and $Z_{02}$, the first signal line and the second signal line at least partially overlap when projected as viewed in a direction in which the two are layered on top of each other, and the first feedback signal line and the second feedback signal line at least partially overlap when projected as viewed in the direction in which the two are layered on top of each other, signal coupling occurs between the first signal line and the second signal line using capacitive coupling and inductive coupling, and feedback signal coupling occurs between the first feedback signal line and the second feedback signal line using capacitive coupling and inductive coupling, a first insulating substrate and a second insulating substrate are layered on top of each other so that the signal coupling allows a signal from the first signal line to be transmitted through the second signal line, either the first module or the second module has a third feedback signal line that provides a third signal line and a feedback path for the third signal line to the first signal line or the second signal line with a dummy coupler in between, and the inter-module communication apparatus further comprises:
a third terminating member that terminates the third signal line and the third feedback signal line; and
a third semiconductor integrated circuit apparatus with a transmitting and receiving circuit that is connected to the third signal line and the third feedback signal line.

3. An inter-module communication apparatus, comprising a first module and a second module that are arranged in close proximity so as to face each other, wherein the first module at least includes:
a first signal line of which the characteristic impedance has an impedance of $Z_{01}$;
a first feedback signal line for providing a feedback path for the first signal line;
a first terminating member that terminates the first signal line and the first feedback signal line; and
a first semiconductor integrated circuit apparatus with a transmitting and receiving circuit, the second module at least includes:
a second signal line of which the characteristic impedance has an impedance of $Z_{02}$;
a second feedback signal line for providing a feedback path for the second signal line;
a second terminating member that terminates the second signal line and the second feedback signal line; and
a second semiconductor integrated circuit apparatus with a transmitting and receiving circuit, the impedances of the first terminating member and the second terminating member are coupling impedances that reflect the proximity effects in a coupling state of the first module and the second module, which are different from $Z_{01}$ and $Z_{02}$, the first signal line and the second signal line at least partially overlap when projected as viewed in a direction in which the two are layered on top of each other, and the first feedback signal line and the second feedback signal line at least partially overlap when projected as viewed in the direction in which the two are layered on top of each other, signal coupling occurs between the first signal line and the second signal line using capacitive coupling and inductive coupling, and feedback signal coupling occurs between the first feedback signal line and the second feedback signal line using capacitive coupling and inductive coupling, a first insulating substrate and a second insulating substrate are layered on top of each other so that the signal coupling allows a signal from the first signal line to be transmitted through the second signal line, the first signal line is connected to the first semiconductor integrated circuit apparatus through a first leading transmission line that has a coupling impedance reflecting the proximity effects in the coupling state between the first module and the second module, and the second signal line is connected to the second semiconductor integrated circuit apparatus through a second leading transmission line that has the coupling impedance, and wherein the coupling impedance of the first leading transmission line and the second leading transmission line is almost the same as a characteristic impedance of a single transmission line.

4. The inter-module communication apparatus according to claim 3, wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

5. The inter-module communication apparatus according to claim 3, wherein the line width of the first signal line is greater than or equal to the line width of the first leading transmission line, and the line width of the second signal line is greater than or equal to the line width of the second leading transmission line.

6. The inter-module communication apparatus according to claim 3, wherein the first leading transmission line and the second leading transmission line run in different directions in a state where the first signal line and the second signal line are aligned alongside each other as viewed in the direction in which the two are layered on top of each other.

7. The inter-module communication apparatus according to claim 3, wherein a gap between the first leading transmission line and the second leading transmission line in a direction in which the two face each other is greater than a gap between the first signal line and the second signal line in the direction in which the two face each other.

8. The inter-module communication apparatus according to claim 3, wherein a first auxiliary electromagnetic shield layer that shields the first leading transmission line is provided to a surface of the first insulating substrate, at least on the side opposite to the surface on which the first leading transmission line is arranged, that faces the second module.

9. The inter-module communication apparatus according to claim 3, wherein a side of the coupling portion between the first signal line and the first leading transmission line is curved, and a side of the coupling portion between the second signal line and the second leading transmission line is curved.

10. The inter-module communication apparatus according to claim 3, wherein a first impedance adjusting transmission line is provided to an end of the first signal line on the side opposite to the coupling portion between the first signal line and the first leading transmission line, a first impedance matching circuit is connected to the first impedance adjusting transmission line, a second impedance adjusting transmission line is provided to an end of the second signal line on the side opposite to the coupling portion between the second signal line and the second leading transmission line, and a second impedance matching circuit is connected to the second impedance adjusting transmission line.

11. The inter-module communication apparatus according to claim 10, wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

12. The inter-module communication apparatus according to claim 10, wherein the line width of the first signal line is greater than or equal to the line width of the first leading transmission line and the line width of the first impedance adjusting transmission line, and the line width of the second signal line is greater than or equal to the line width of the second leading transmission line and the line width of the second impedance adjusting transmission line.

13. The inter-module communication apparatus according to claim 3, wherein a third leading transmission line is provided to an end of the first signal line on the side opposite to the coupling portion between the first signal line and the first leading transmission line, a semiconductor integrated circuit apparatus with a transmitting and receiving circuit is connected to the third leading transmission line, a fourth leading transmission line is provided to an end of the second signal line on the side opposite to the coupling portion between the second signal line and the second leading transmission line, and a semiconductor integrated circuit apparatus with a transmitting and receiving circuit is connected to the fourth leading transmission line.

14. An inter-module communication apparatus, comprising a first module and a second module that are arranged in close proximity so as to face each other, wherein the first module at least includes:

a first signal line of which the characteristic impedance has an impedance of $Z_{01}$;

a first feedback signal line for providing a feedback path for the first signal line;

a first terminating member that terminates the first signal line and the first feedback signal line; and a first semiconductor integrated circuit apparatus with a transmitting and receiving circuit, the second module at least includes:

a second signal line of which the characteristic impedance has an impedance of $Z_{02}$;

a second feedback signal line for providing a feedback path for the second signal line;

a second terminating member that terminates the second signal line and the second feedback signal line; and a second semiconductor integrated circuit apparatus with a transmitting and receiving circuit, the impedances of the first terminating member and the second terminating member are coupling impedances that reflect the proximity effects in a coupling state of the first module and the second module, which are different from $Z_{01}$ and $Z_{02}$, the first signal line and the second signal line at least partially overlap when projected as viewed in a direction in which the two are layered on top of each other, and the first feedback signal line and the second feedback signal line at least partially overlap when projected as viewed in the direction in which the two are layered on top of each other, signal coupling occurs between the first signal line and the second signal line using capacitive coupling and inductive coupling, and feedback signal coupling occurs between the first feedback signal line and the second feedback signal line using capacitive coupling and inductive coupling, a first insulating substrate and a second insulating substrate are layered on top of each other so that the signal coupling allows a signal from the first signal line to be transmitted through the second signal line, the first feedback signal line forms a differential line with the first signal line, the second feedback signal line forms a differential line with the second signal line, and either a gap between the first signal line and the second signal line or the width of an overlap between the first signal line and the second signal line is different depending on a direction in which signals propagate so that a coupling state between the first signal line and the second signal line is different depending on the direction in which the signals propagate, and wherein frequency characteristics of coupling coefficients for the first signal line and the second signal line are flat.

15. An inter-module communication apparatus, comprising a first module and a second module that are arranged in close proximity so as to face each other, wherein the first module at least includes:
  a first signal line of which the characteristic impedance has an impedance of $Z_{01}$;
  a first feedback signal line for providing a feedback path for the first signal line;
  a first terminating member that terminates the first signal line and the first feedback signal line; and
  a first semiconductor integrated circuit apparatus with a transmitting and receiving circuit, the second module at least includes:
  a second signal line of which the characteristic impedance has an impedance of $Z_{02}$;
  a second feedback signal line for providing a feedback path for the second signal line;
  a second terminating member that terminates the second signal line and the second feedback signal line; and
  a second semiconductor integrated circuit apparatus with a transmitting and receiving circuit, the impedances of the first terminating member and the second terminating member are coupling impedances that reflect the proximity effects in a coupling state of the first module and the second module, which are different from $Z_{01}$ and $Z_{02}$, the first signal line and the second signal line at least partially overlap when projected as viewed in a direction in which the two are layered on top of each other, and the first feedback signal line and the second feedback signal line at least partially overlap when projected as viewed in the direction in which the two are layered on top of each other, signal coupling occurs between the first signal line and the second signal line using capacitive coupling and inductive coupling, and feedback signal coupling occurs between the first feedback signal line and the second feedback signal line using capacitive coupling and inductive coupling, a first insulating substrate and a second insulating substrate are layered on top of each other so that the signal coupling allows a signal from the first signal line to be transmitted through the second signal line, the first feedback signal line forms a differential line with the first signal line, the second feedback signal line forms a differential line with the second signal line, either the first module or the second module has a third feedback signal line that provides a third signal line and a feedback path that forms a differential line with the third signal line to the first signal line or the second signal line with a dummy coupler in between, and the inter-module communication apparatus further comprises:
  a third terminating member that terminates the third signal line and the third feedback signal line; and
  a third semiconductor integrated circuit apparatus with a transmitting and receiving circuit that is connected to the third signal line and the third feedback signal line.

16. An inter-module communication apparatus, comprising a first module and a second module that are arranged in close proximity so as to face each other, wherein the first module at least includes:
  a first signal line of which the characteristic impedance has an impedance of $Z_{01}$;
  a first feedback signal line for providing a feedback path for the first signal line;
  a first terminating member that terminates the first signal line and the first feedback signal line; and
  a first semiconductor integrated circuit apparatus with a transmitting and receiving circuit, the second module at least includes:
  a second signal line of which the characteristic impedance has an impedance of $Z_{02}$;
  a second feedback signal line for providing a feedback path for the second signal line;
  a second terminating member that terminates the second signal line and the second feedback signal line; and
  a second semiconductor integrated circuit apparatus with a transmitting and receiving circuit, the impedances of the first terminating member and the second terminating member are coupling impedances that reflect the proximity effects in a coupling state of the first module and the second module, which are different from $Z_{01}$ and $Z_{02}$, the first signal line and the second signal line at least partially overlap when projected as viewed in a direction in which the two are layered on top of each other, and the first feedback signal line and the second feedback signal line at least partially overlap when projected as viewed in the direction in which the two are layered on top of each other, signal coupling occurs between the first signal line and the second signal line using capacitive coupling and inductive coupling, and feedback signal coupling occurs between the first feedback signal line and the second feedback signal line using capacitive coupling and inductive coupling, a first insulating substrate and a second insulating substrate are layered on top of each other so that the signal coupling allows a signal from the first signal line to be transmitted through the second signal line, the first feedback signal line forms a differential line with the first signal line, the second feedback signal line forms a differential line with the second signal line, the first signal line and the first feedback signal line have coupling impedances that reflect the proximity effects in the coupling states with the first module and the second module, respectively, and have a leading transmission line connected to the first semiconductor integrated circuit apparatus, and the second signal line and the second feedback signal line have the coupling impedances, respectively, and a leading transmission line connected to the second semiconductor integrated circuit apparatus, and wherein a coupling impedance of the leading transmission line connected to the first semiconductor integrated circuit apparatus and the leading transmission line connected to the second semiconductor integrated circuit apparatus is almost the same as a characteristic impedance of a single transmission line.

17. The inter-module communication apparatus according to claim 16, wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

18. The inter-module communication apparatus according to claim 16, wherein the line widths of the first signal line and the first feedback signal line are greater than or equal to the line width of the leading transmission line, and the line widths of the second signal line and the second feedback signal line are greater than or equal to the line width of the leading transmission line.

19. The inter-module communication apparatus according to claim 16, wherein a gap between the first signal line and the first feedback signal line is greater than or equal to a gap between the leading transmission lines, and a gap between the second signal line and the second feedback signal line is greater than or equal to the gap between the leading transmission lines.

20. The inter-module communication apparatus according to claim 16, wherein a gap between the first signal line and the first feedback signal line is greater than or equal to the line widths of the first signal line and the first feedback signal line, and a gap between the second signal line and the second feedback signal line is greater than or equal to line widths of the second signal line and the second feedback signal line.

21. The inter-module communication apparatus according to claim 16, wherein the leading transmission line connected to the first semiconductor integrated circuit apparatus and the leading transmission line connected to the second semiconductor integrated circuit apparatus run in different directions in a state where the first signal line and the second signal line are aligned alongside each other as viewed in the direction in which the two are layered on top of each other.

22. The inter-module communication apparatus according to claim 16, wherein a gap between the leading transmission line connected to the first semiconductor integrated circuit apparatus and the leading transmission line connected to the second semiconductor integrated circuit apparatus in a direction in which the two face each other is greater than a gap between the first signal line and the second signal line in the direction in which the two face each other.

23. The inter-module communication apparatus according to claim 16, wherein a first auxiliary electromagnetic shield layer that shields the leading transmission line connected to the first semiconductor integrated circuit apparatus is provided to a surface of the first insulating substrate, at least on the side opposite to the surface on which the first leading transmission line is arranged, that faces the second module.

24. The inter-module communication apparatus according to claim 16, wherein a side of the coupling portion between the first signal line and the leading transmission line is curved, a side of the coupling portion between the first feedback signal line and the leading transmission line is curved, a side of the coupling portion between the second signal line and the leading transmission line is curved, and a side of the coupling portion between the second feedback signal line and the leading transmission line is curved.

25. The inter-module communication apparatus according to claim 16, wherein a first impedance adjusting transmission line is provided to an end of the first signal line on the side opposite to the coupling portion between the first signal line and the leading transmission line connected to the first semiconductor integrated circuit apparatus, a first impedance matching circuit is connected to the first impedance adjusting transmission line, a second impedance adjusting transmission line is provided to an end of the second signal line on the side opposite to the coupling portion between the second signal line and the leading transmission line connected to the second semiconductor integrated circuit apparatus, and a second impedance matching circuit is connected to the second impedance adjusting transmission line.

26. The inter-module communication apparatus according to claim 16, wherein leading transmission lines connected to a semiconductor integrated circuit apparatus with a transmitting and receiving circuit are provided to respective ends of the first signal line and the first feedback signal line on the side opposite to the coupling portions between the first signal line and the leading transmission line connected to the first semiconductor integrated circuit apparatus as well as between the first feedback signal line and the leading transmission line connected to the first semiconductor integrated circuit apparatus, leading transmission lines connected to a semiconductor integrated circuit apparatus with a transmitting and receiving circuit are provided to respective ends of the second signal line and the second feedback signal line on the side opposite to the coupling portions between the second signal line and the leading transmission line connected to the second semiconductor integrated circuit apparatus as well as between the second feedback signal line and the leading transmission line connected to the second semiconductor integrated circuit apparatus, and the impedances of the respective leading transmission lines are coupling impedances that reflect the proximity effects in the coupling states with the first module and the second module and that are different from $Z_{01}$ and $Z_{02}$.

27. The inter-module communication apparatus according to claim 26, wherein a first plate that at least misses the portion facing the first signal line is provided to a surface of the first insulating substrate on the side opposite to the surface on which the first signal line is arranged, and a second plate that at least misses the portion facing the second signal line is provided to a surface of the second insulating substrate on the side opposite to the surface on which the second signal line is arranged.

28. The inter-module communication apparatus according to claim 26, wherein the line widths of the first signal line and the first feedback signal line are greater than or equal to the line width of the leading transmission line, and the line widths of the second signal line and the first feedback signal line are greater than or equal to the line width of the leading transmission line.

29. The inter-module communication apparatus according to claim 26, wherein a gap between the first signal line and the first feedback signal line is greater than or equal to a gap between the leading transmission lines, and a gap between the second signal line and the second feedback signal line is greater than or equal to a gap between the leading transmission lines.

30. The inter-module communication apparatus according to claim 26, wherein a gap between the first signal line and the first feedback signal line is greater than or equal to the line widths of the first signal line and the first feedback signal line, and a gap between the second signal line and the second feedback signal line is greater than or equal to line widths of the second signal line and the second feedback signal line.

* * * * *